US011282861B2

(12) United States Patent
Nelson et al.

(10) Patent No.: US 11,282,861 B2
(45) Date of Patent: Mar. 22, 2022

(54) DYNAMIC LOGIC BUILT WITH STACKED TRANSISTORS SHARING A COMMON GATE

(71) Applicant: Intel Corporation, Santa Clara, CA (US)

(72) Inventors: Donald W. Nelson, Beaverton, OR (US); Rishabh Mehandru, Portland, OR (US)

(73) Assignee: Intel Corporation, Santa Clara, CA (US)

(*) Notice: Subject to any disclaimer, the term of this patent is extended or adjusted under 35 U.S.C. 154(b) by 67 days.

(21) Appl. No.: 15/774,556

(22) PCT Filed: Dec. 26, 2015

(86) PCT No.: PCT/US2015/000489
§ 371 (c)(1),
(2) Date: May 8, 2018

(87) PCT Pub. No.: WO2017/111866
PCT Pub. Date: Jun. 29, 2017

(65) Prior Publication Data
US 2019/0355756 A1    Nov. 21, 2019

(51) Int. Cl.
*H01L 23/538* (2006.01)
*H01L 27/12* (2006.01)
(Continued)

(52) U.S. Cl.
CPC ...... *H01L 27/1211* (2013.01); *H01L 21/8221* (2013.01); *H01L 21/823821* (2013.01);
(Continued)

(58) Field of Classification Search
CPC ............ H01L 27/0688; H01L 27/1211; H01L 21/8221; H01L 21/823821; H01L 23/5386
See application file for complete search history.

(56) References Cited

U.S. PATENT DOCUMENTS 5,834,354 A * 11/1998 Kadosh ............... H01L 21/8221
438/305
6,208,907 B1    3/2001 Durham et al.
(Continued)

FOREIGN PATENT DOCUMENTS

| CN | 1679237 | 10/2005 |
|---|---|---|
| CN | 104160482 | 11/2014 |
| WO | WO 2014/209278 | 12/2014 |

OTHER PUBLICATIONS

Morrow et al., Dec. 31, 2014, WO 2014/209278 A1.*
(Continued)

*Primary Examiner* — Suberr L Chi
(74) *Attorney, Agent, or Firm* — Schwabe, Williamson & Wyatt, P.C.

(57) ABSTRACT

A dynamic logic circuit including a first transistor within a first device stratum of a substrate; and a second transistor within a second device stratum of the substrate that is different from the first device stratum, wherein the first transistor and the second transistor share a common gate electrode. A method including disposing a second semiconductor body of a second transistor on a first semiconductor body of a first transistor in a first device stratum on a substrate, the second semiconductor body defining a second device stratum; and forming a common gate electrode on each of the semiconductor body and the second semiconductor body.

20 Claims, 18 Drawing Sheets

(51) Int. Cl.
  *H01L 21/822* (2006.01)
  *H01L 21/8238* (2006.01)
  *H01L 21/84* (2006.01)
  *H01L 27/06* (2006.01)

(52) U.S. Cl.
  CPC .... *H01L 21/823828* (2013.01); *H01L 21/845* (2013.01); *H01L 27/0688* (2013.01)

(56) References Cited

U.S. PATENT DOCUMENTS

| | | | |
|---|---|---|---|
| 10,020,371 | B2 | 7/2018 | Pillarisetty et al. |
| 2005/0239242 | A1 | 10/2005 | Zhu et al. |
| 2006/0290383 | A1 | 12/2006 | Chuang |
| 2007/0069280 | A1 | 3/2007 | Kim |
| 2009/0302894 | A1 | 12/2009 | Chuang et al. |
| 2010/0219479 | A1 | 9/2010 | Nuttinck |
| 2011/0199116 | A1 | 8/2011 | Or-Bach |
| 2012/0018808 | A1* | 1/2012 | Isobe .................. H01L 27/0688 257/347 |
| 2014/0035041 | A1 | 2/2014 | Pillarisetty |

OTHER PUBLICATIONS

International Preliminary Report on Patentability for PCT Patent Application No. PCT/US2015/000489 dated Jul. 5, 2018, 11 pgs.
Search Report for European Patent Application No. 15911563.3, dated Jul. 2, 2019, 10 pgs.
International Search Report and Written Opinion for International Patent Application No. PCT/US2015/000489 dated Oct. 20, 2016, 14 pgs.
Office Action for Chinese Patent Application No. 201580084872.3, dated Jan. 5, 2021, 11 pgs.
Office Action for Taiwan Patent Application No. 105138908, dated May 24, 2021, 9 pgs.
Office Action for Chinese Patent Application No. 201580084872.3, dated Jun. 10, 2021, 9 pgs.
Office Action for Chinese Patent Application No. 201580084872.3, dated Jan. 6, 2022, 10 pgs., no translation.

* cited by examiner

US 11,282,861 B2

DYNAMIC LOGIC BUILT WITH STACKED TRANSISTORS SHARING A COMMON GATE

CROSS-REFERENCE TO RELATED APPLICATION

This patent application is a U.S. National Phase Application under 35 U.S.C. § 371 of International Application No. PCT/US2015/000489, filed Dec. 26, 2015, entitled "DYNAMIC LOGIC BUILT WITH STACKED TRANSISTORS SHARING A COMMON GATE," which designates the United States of America, the entire disclosure of which is hereby incorporated by reference in its entirety and for all purposes.

BACKGROUND

Field

Integrated circuit devices.

Description of Related Art

Dynamic logic generally uses a clock signal in its implementation of combinational logic circuits. A clock signal is tied to a P-type transistor and an N-type transistor for a two phase operation (precharge and evaluate phases). In a precharge phase, the clock signal is low and an output value is driven high ($V_{DD}$). During the evaluation phase, the clock is high. If an input is also high the output will be pulled low.

DETAILED DESCRIPTION

Monolithic three-dimensional integrated circuit structures are described that, in one embodiment, include at least two device strata to implement a logic circuit. In one embodiment, a dynamic logic circuit including devices in different device strata is described. In one embodiment, ones of transistors of a first and second device stratum share a common gate to build dynamic logic gates. The implementation of devices in different strata saves die area over a planar design of dynamic logic. In one embodiment, the savings in an overall die area by a dynamic logic circuit incorporating transistors of different device strata is achieved by, for example, compressing a P-type precharge transistor over an n-type evaluate transistor. Additional inverters or NAND or NOR gates can also use transistors from different levels optionally including gate sharing to save area.

Figure 1:
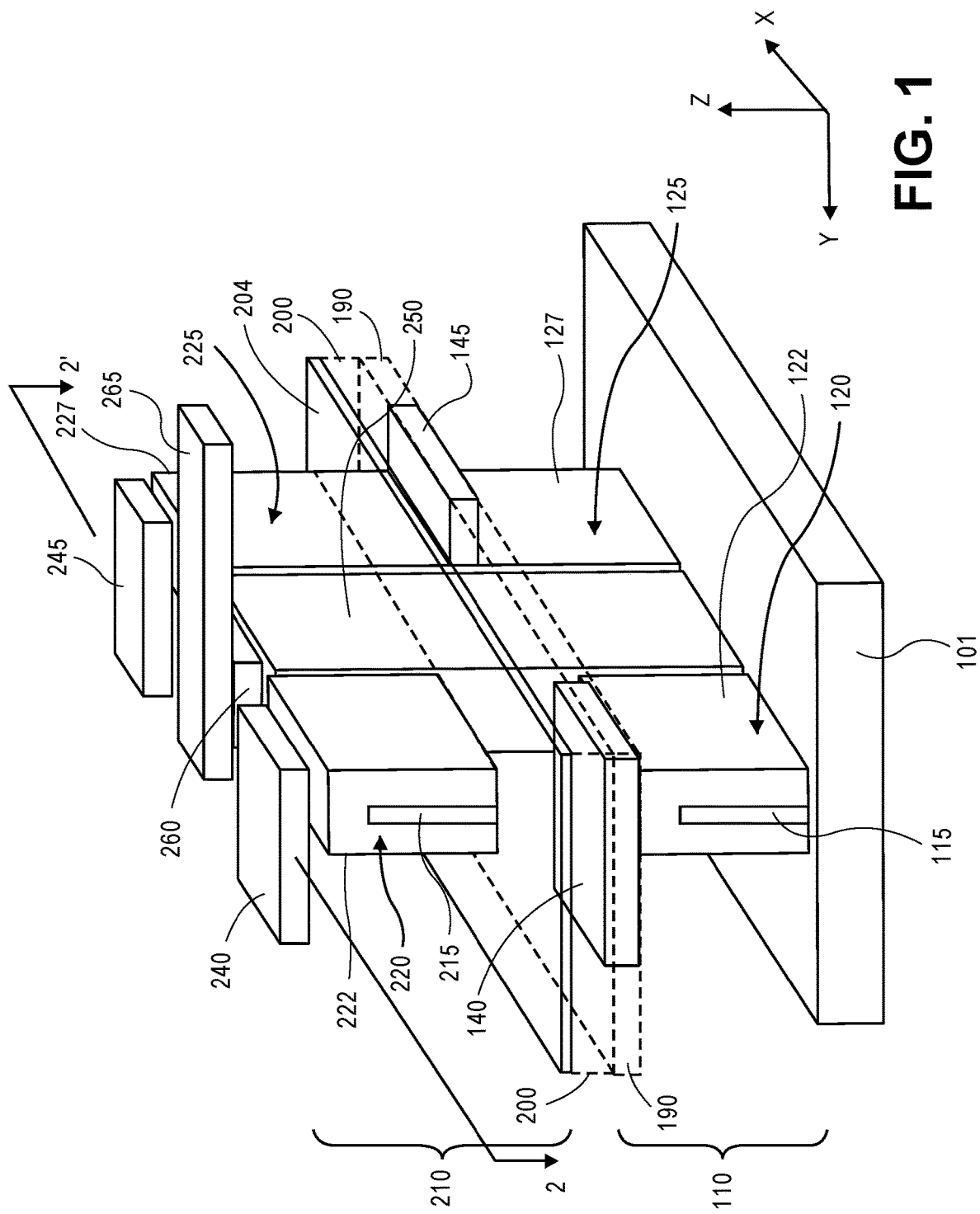
FIG. 1 shows a top side perspective view of a three-dimensional integrated circuit structure including two device strata and a transistor device on each stratum sharing a gate electrode.

FIG. 1 shows a top side perspective view of a three-dimensional integrated circuit structure including two device strata. Referring to FIG. 1, structure 100 includes substrate 101 on which the device strata are disposed. Substrate 101 may be any substrate known in the art to be suitable for forming an integrated circuit, such as, but not limited to, a semiconductor substrate, semiconductor-on-insulator (SOI) substrate, or an insulator substrate (e.g., sapphire), the like and/or combinations thereof. In one embodiment, substrate 101 comprises a substantially monocrystalline semiconductor, such as, but not limited to, silicon. Disposed or formed on substrate 101 is device stratum 110 and disposed on device stratum 110 is device stratum 210. Device stratum 110 includes semiconductor body 115 extending laterally over an area of substrate 101 (e.g., a surface of substrate 101). A laterally oriented transistor generally entails a semiconductor channel region occupying a first area of a substrate while semiconductor source and drain diffusion regions occupy a second area of the substrate (in contrast to a vertical orientation where a channel region occupies the same substrate area as the source/drain).

Device stratum 210 includes semiconductor body 215 which is advantageously substantially monocrystalline, although polycrystalline embodiments are possible. In this embodiment, semiconductor bodies in both device strata are fins and body 715 is aligned with body 615 in a two-dimension. While a fin based field effect transistor ("finFET") architecture represents a current state of the art in manufacturable transistor technology, alternate embodiments are also possible where one or more semiconductor bodies for one or more device strata or transistor levels in a three-dimensional integrated circuit is planar or has any other non-planar structure known in the art, such as nanoribbon, nanowire. Furthermore, one device strata may have semiconductor bodies of a first type (e.g., fins) while another strata may have semiconductor bodies of a second type (e.g., planar).

Referring again to device stratum 110 and semiconductor body 115, the semiconductor body includes diffusion regions designated as source 120 and drain 125 separated by a channel region surrounded by gate stack 250. In one embodiment, source 120 and drain 125 are a P-type diffusion regions. Accordingly, for a semiconductor material of body 115 of silicon or germanium, the semiconductor body may be doped with a P-type dopant such as boron. Disposed over source 120 is metallization 122 and over drain 125 is metallization 127 such as tungsten or other metal or metal compound. Connected to the metallization 122 is electrically conductive interconnect 140 and connected to metallization 127 is interconnect 145. A representative material for interconnect 140 and interconnect 145 is copper.

Semiconductor body 215 of, for example, a monocrystalline semiconductor such as silicon or germanium includes diffusion regions designated as source 220 and drain 225 and a channel region between the source and drain with gate stack 250 overlying the channel region. In one embodiment, source 220 and drain 225 are N-type diffusion regions. Accordingly, for a semiconductor material of body 215 is representatively doped with an N-type dopant such as phosphorous or arsenic in the diffusion regions. Disposed on source 220 is metallization 222 and disposed on drain 225 is metallization 227 disposed on metallization 222 on source 220 is interconnect 240 and disposed on metallization of drain 225 is interconnect 245. In one embodiment, the metallization 227 is tungsten or other metal or metal compound. A representative material for interconnect 240 and interconnect 245 is copper.

Figure 2:
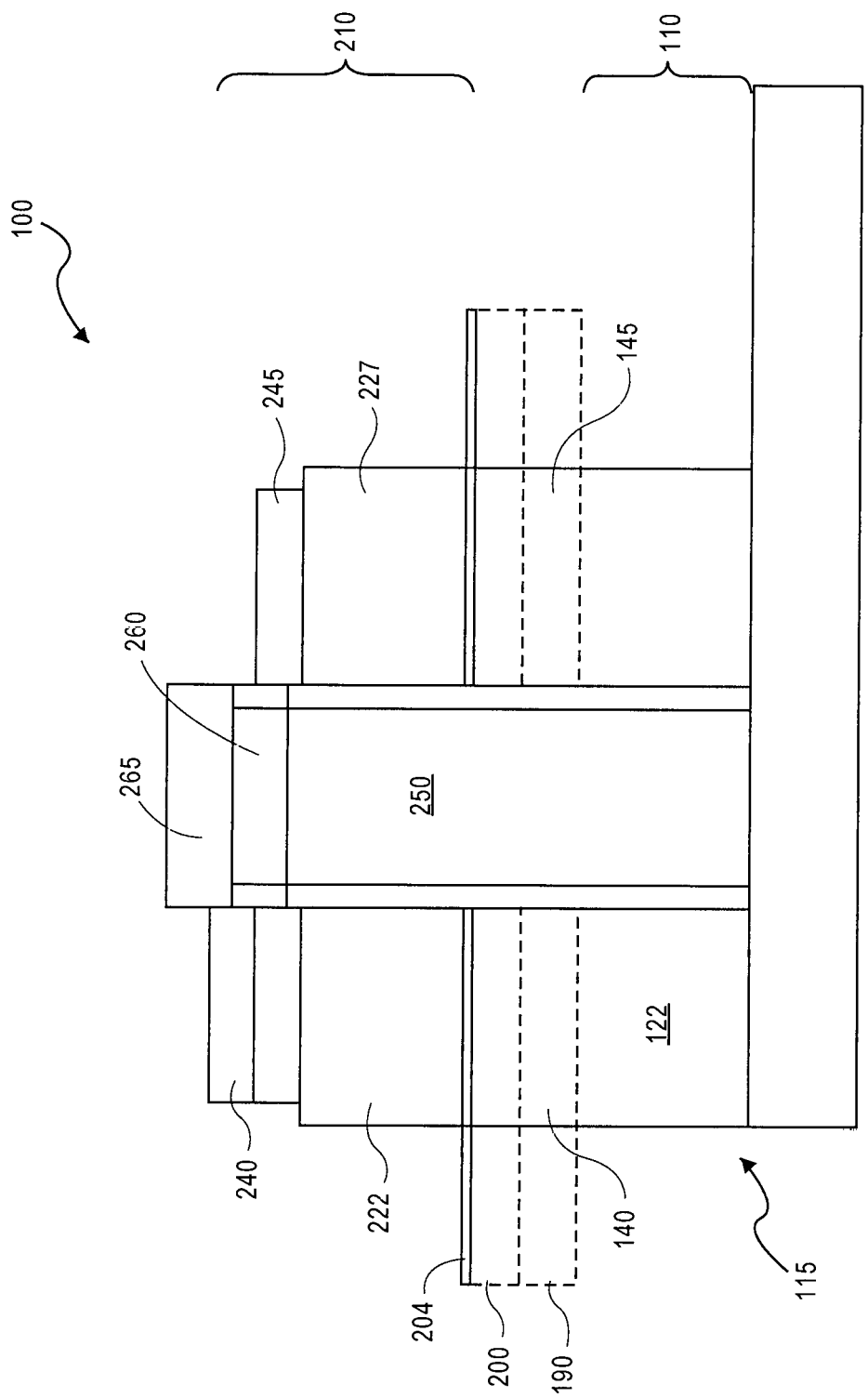
FIG. 2 shows the structure of FIG. 1 through line 2-2'.

As illustrated in FIG. 1 and FIG. 2, the devices of each device stratum share a common gate electrode. In this embodiment, a gate stack including a gate dielectric (not visible) and gate electrode 250 are disposed on semiconductor body 215 and disposed and semiconductor body 115 to form a gate stack capable of modulating conductivity between source 120 and drain 125 and source 220 and drain 225 by way of a field effect within the respective channel regions. The gate dielectric layer may include one layer or a stack of layers. The one or more layers may include silicon oxide, silicon dioxide ($SiO_2$) and/or a dielectric material having a dielectric constant greater than silicon dioxide (a high-k material). Representative high-k dielectric materials include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafniumite oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc neogate. Gate electrode 250 is formed on the gate dielectric layer and they consist of a metal or a silicide. Such gate electrode material may optionally be selected for a P-type work function or an N-type work function. In some implementations, the gate electrode may consist of a stack of two or more layers, where one or more layers are work function layers and one layer is a fill layer. FIG. 1 also shows a pair of side wall spacers 254 formed on opposing sides of the gate stack that bracket the gate stack. Side wall spacers 254 may be formed from a dielectric material such as but not limited to silicon nitride, silicon oxide, silicon carbide, silicon oxy-nitride, carbon-doped oxide and combinations thereof. FIGS. 1 and 2 show gate electrode metallization 260 of a metal such as but not limited to tungsten connected at a top surface of gate electrode 250 and interconnect 265 of a metal such as but not limited to copper connected to gate electrode metallization 260.

Source 120 and drain 125 in semiconductor body 115 are generally formed using either an implantation/diffusion process or an etching/deposition process. In the former process, dopants such as boron or aluminum, the ion-implanted into the substrate to form the source in drain regions. An anealing process typically follows the ion implantation process that typically activates the dopants and causes the dopants to diffuse further into the substrate. In the etching/deposition process, semiconductor body 115 may be etched to form recesses at locations of source and drain regions. An epitaxial deposition process may then be carried out to fill the recesses with a material that is used to fabricate the diffusion regions. In some implementations, the source and drain diffusion regions may be fabricated using a silicon alloy such as silicon germanium or silicon carbide. In some implementations, an epitaxially deposited silicon alloy may be doped in situ with dopants such as boron or aluminum. In further embodiments, source 120 and drain 125 may be formed using one or more alternate semiconductor materials such as germanium or a group III-IV or group IV-V material or alloy. In still further embodiments, one or more layers of metal and/or metal alloys may be used to form the source and drain diffusion regions.

Between device stratum 110 and device stratum 210 is one or more inter-level dielectric layers. In the illustrative embodiment shown in FIG. 1 and FIG. 2, inter-level dielectric layer 200 disposed in contact with intra-level dielectric layer 190, both of which are drawn in dashed lines so as to not obscure other features of structure 100. One or more intra-level dielectric layers may be disposed under intra-level dielectric layer 190 to isolate various conductive regions of device stratum 110, and one or more intra-level dielectric layers may be similarly disposed over inter-level dielectric layer 200 to isolate various conductive regions of device stratum 210. For the sake of clarity, the various intra-level dielectrics are not delineated in FIGS. 1 and 2. Inter-level dielectric layer 200 is in direct contact with at least monocrystalline substrate 204. An interface between top inter-level dielectric layer 200 and intra-level dielectric layer 190, may, for example, result from bonding a donor substrate to the device stratum on substrate 101. The composition of dielectric layers 160 and 200 may be the same or differ from each other with any dielectric composition known in the art being generally permissible. Exemplary materials include silicon dioxide, silicon nitride, silicon-oxy-nitride, carbon-doped silicon dioxide or another low-k material.

In accordance with embodiments, transistors of at least two different strata are connected by local inter-level interconnects intersecting a source/drain of a transistor in at least one level and extending vertically as viewed (e.g., substantially orthogonally to the laterally-oriented transistors) through at least one inter-level dielectric layer between device stratum 110 and device stratum 210. FIG. 1 includes drain metallization 227 as an inter-level interconnect extending in a z-dimension through interlevel dielectric layer 200 to connect to interconnect 145 on a level associated with device stratum 110 and to interconnect 245 on a level associated with device stratum 210 to connect the drains of the devices.

As shown in FIG. 2, drain metallization 227 is electrically connected with drain metallization 127 indirectly by way of intervening intra-level interconnect 145 disposed below device stratum 210. In an alternative embodiment, drain metallization 227 electrically connects directly to drain metallization 127 extending vertically both through inter-level dielectric layer 200 and intra-level dielectric layer 190. Such an embodiment is possible where drain metallization 227 is laterally aligned to be directly over drain metallization 127.

Figure 3:
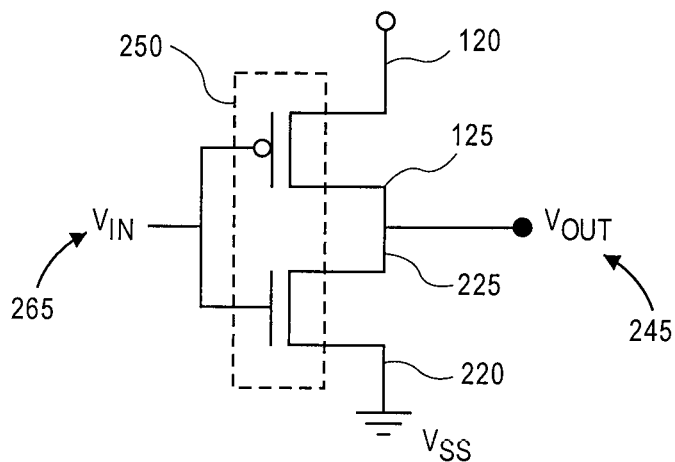
FIG. 3 shows a circuit diagram of an inverter described with reference to FIGS. 1-2.

FIG. 3 shows a circuit diagram of an inverter. In one embodiment, an inverter can be formed in different device strata and share a common gate electrode. FIG. 3 is thus mapped to the structure shown in FIG. 1 and FIG. 2.

In one embodiment, an inverter employs transistors from different device strata of an integrated circuit structure a three-dimensional (3D) inverter (a 3D inverter including two metal oxide semiconductor field effect transistors (MOSFETs) in different device strata. FIG. 3 shows a circuit schematic of an inverter mapped to the transistors and interconnects depicted in FIG. 1 and FIG. 2. In one embodiment, the inverter employs a P-type transistor in device stratum 110 and an N-type transistor in device stratum 210 with a gate electrode shared between the device. Source 120 of the P-type device is connected to $V_{DD}$ and source 220 of the N-type device is connected to $V_{SS}$. The devices share a common gate 250 that is connected to input line 265. FIG. 3 also shows drain 125 of the P-type device connected to drain 225 of the N-type device. Drains 125 and 225 of each device are connected to output line 245. It is appreciated that in another embodiment an N-type transistor may be employed in, device stratum 110 with a P-type transistor in device stratum 210 and a shared gate between the devices.

Figure 4:
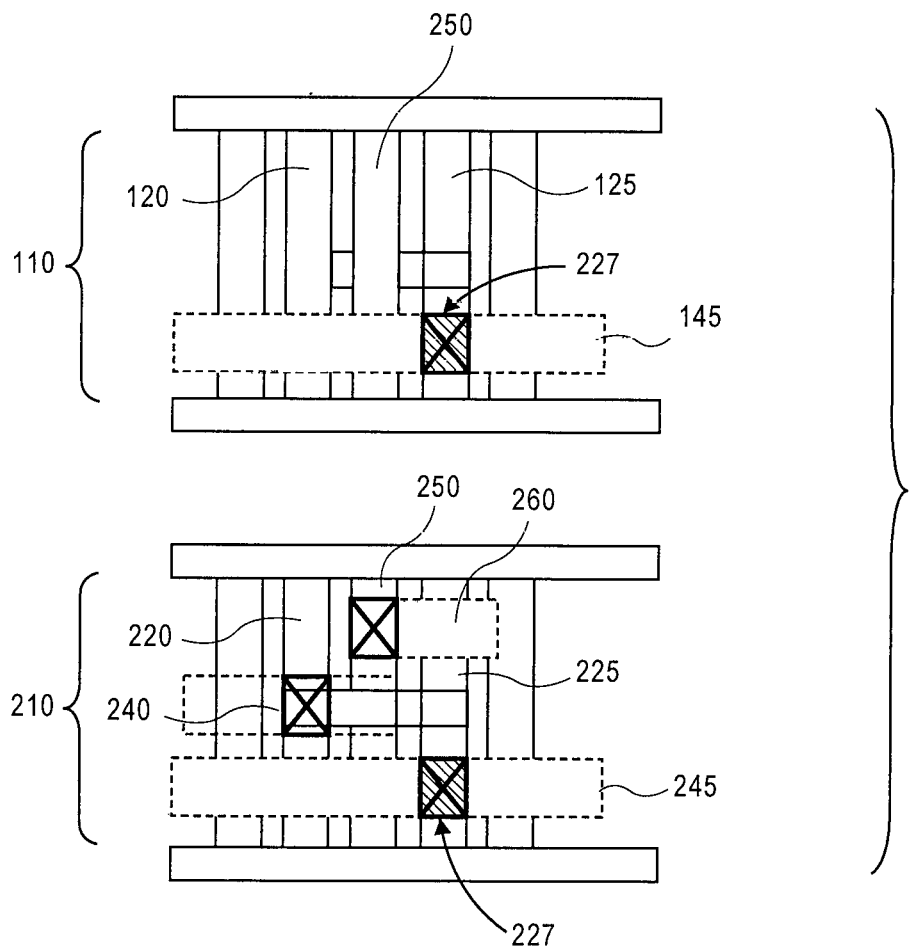
FIG. 4 shows a schematic cell layout for the inverter described with reference to FIGS. 1-3.

FIG. 4 shows a schematic cell layout for the inverter described with reference to FIGS. 1-3. FIG. 4 shows P-type device on device stratum 110 and N-type device on device stratum 210. The P-type device includes source 120 connected to $V_{SS}$ and drain 125 connected to drain 225 of N-type device in device stratum 210 through drain metallization 227 that connects to interconnect 145 and interconnect 245 with interconnect 245 operable to connect to an output. FIG. 4 also shows gate 250 shared between the P-type device and the N-type device and connected to interconnect 260 to connect the inverter to an input.

Figure 5:
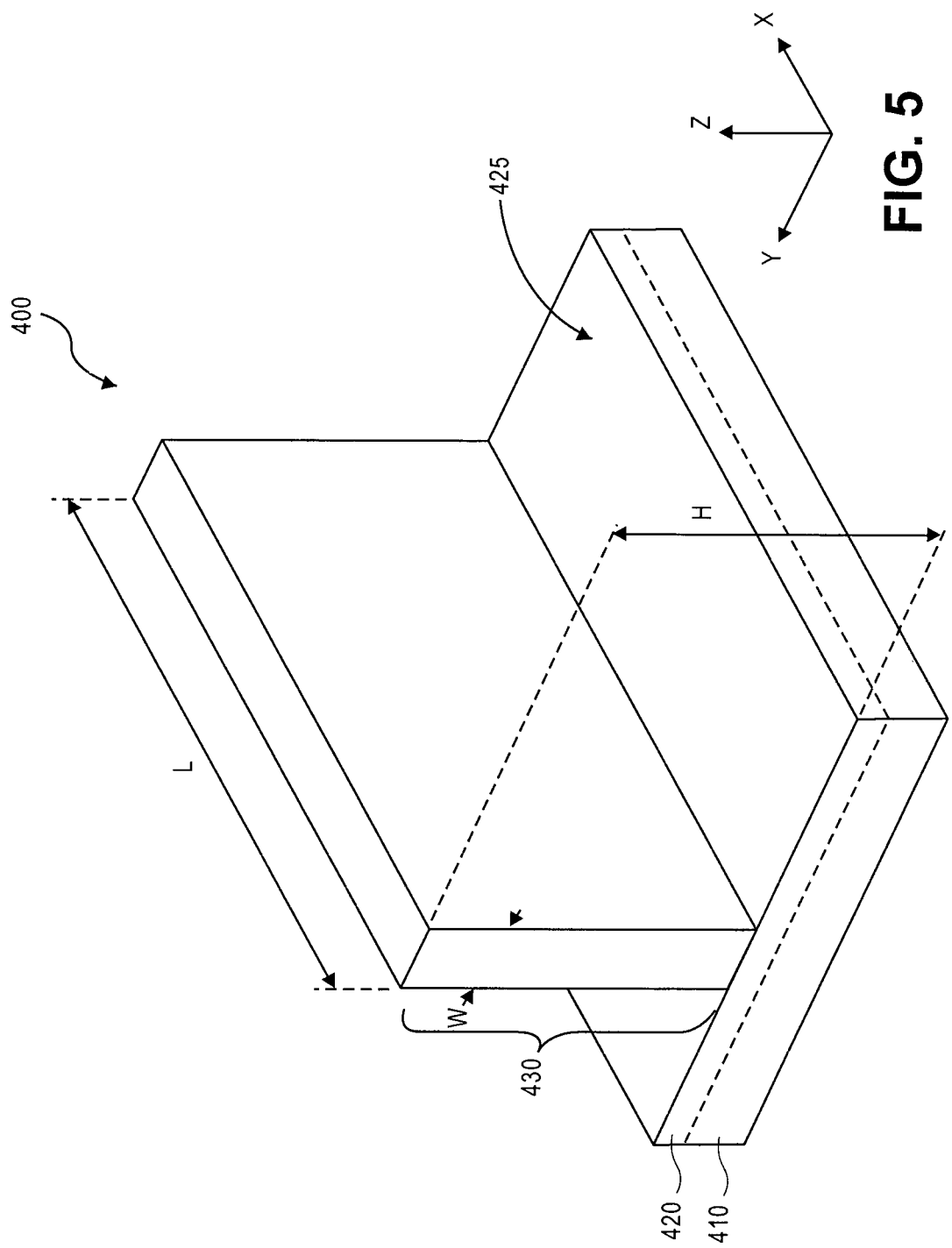
FIG. 5 shows a top side perspective view of a portion of a semiconductor or semiconductor on insulator substrate having a semiconductor body or fin formed thereon.

FIG. 5-12 describe a method or process of forming the inverter described with respect to FIGS. 1-4 including devices (e.g., transistors) in different device strata sharing a common gate electrode. FIG. 5 shows a top side perspective view of a portion of a semiconductor or semiconductor on insulator substrate that is, for example, a portion of an integrated circuit die or chip on a wafer. Specifically, FIG. 5 shows structure 400 including substrate 410 of a semiconductor material such as silicon, germanium or other semiconductor material or SOI. Overlying substrate 410 is optional buffer layer 420. In one embodiment, a buffer layer is a silicon germanium buffer introduced, in one embodiment, in substrate 410 of silicon by a growth technique. Buffer layer 420, if present, has a representative thickness on the order of a few hundred nanometers (nm).

Disposed on a service of substrate 410 and optional buffer layer 420 (surface 425), in the embodiment illustrated in FIG. 5 is a portion of a transistor device such as, in this one embodiment, a P-type transistor device. Common to an N-type or P-type transistor device, in this embodiment, is body or fin 130 disposed on a surface (surface 125) of substrate 110 or buffer layer 120. Fin 430 is representatively a semiconductor material such as silicon, germanium or other semiconductor. In one embodiment, fin has a length dimension, L, greater than a height dimension, H. A representative length range is on the order of 10 nm to one millimeter (mm), and a representative height range is on the order of 5 nm to 200 nm. Fin 430 also has a width, W, representatively on the order of 4-10 nm. As illustrated, fin 430 is a three-dimensional body extending from or on a surface of substrate 410 (or optionally from or on buffer layer 420). The three-dimensional body as illustrated in FIG. 5 is a rectangular body, but it is appreciated that in processing of such bodies a true rectangular form may not be achievable with available tooling and other shapes may result. Representative shapes include, but are not limited to, a trapezoidal shape (e.g., base wider than top) and an arch shape.

Figure 6:
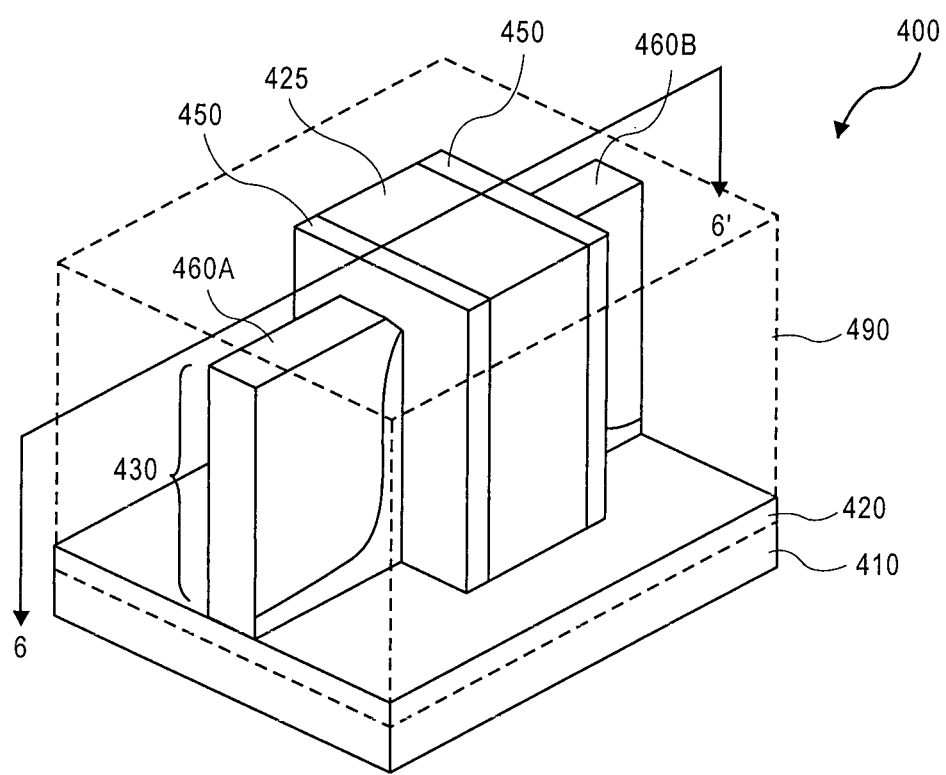
FIG. 6 shows a top side perspective view of the structure of FIG. 1 following the formation of a placeholder gate stack on the fin and a source and a drain in diffusion regions of the fin.

FIG. 6 shows a top side perspective view of the structure of FIG. 1 following the formation of a sacrificial or placeholder gate stack on fin 430. In one embodiment, a placeholder gate stack includes a gate dielectric layer of, for example, silicon dioxide or a high-k dielectric material or materials. Disposed on the gate dielectric layer, in one embodiment is placeholder gate 425 of, for example, polysilicon deposited by, for example, a chemical vapor deposition method. In one embodiment, to form the gate stack, a gate dielectric material is initially formed on the structure of FIG. 6 on the and around fin 430 such as by way of a blanket deposition followed by a similar deposition of a placeholder gate material. A mask material is then introduced over the structure and patterned to protect the gate stack material over a designated channel region. An etch process is then used to remove the gate stack material in undesired areas and pattern the gate stack over a designated channel region. The gate stack may include spacer dielectric layers on opposite sides thereof. A representative material for spacers 450 is a low-k material such as silicon nitride or silicon carbon nitrogen. FIG. 6 shows spacers 450 adjacent to the sidewalls of the gate stack and on fin 430. One technique to form spacers 450 is to deposit a film on the structure and then protect the film in a desired area and then etch to pattern the film into the desired spacer dimensions. Following the formation of placeholder gate 425 on the structure, the structure is encompassed by dielectric material 490 such as silicon dioxide or a low-k material or a combination of silicon dioxide and low-k materials. Dielectric material 490 is shown in dashed lines so as not to obscure other features of structure 400.

FIG. 6 also shows the structure of FIG. 5 after the formation of diffusion regions (source and drain) in fin 430. Source 460A and drain 460B are formed in fin 430 on opposite sides of the gate stack. Source 460A and drain 460B may be formed by removing portions of the fin material and epitaxially introducing source and drain material. Representative material for source 460A and drain 460B for a P-type device include, but are not limited to, silicon, silicon germanium or a group III-V or group IV-V compound semiconductor material. Concomitantly with or following the introduction of source and drain material, the source and drain are optionally doped with a P-type dopant such as but not limited to boron. In another embodiment, rather than removing fin material and replacing it with introduced source and drain material, source 460A and drain 460B may be formed by implanting material into designated source and drain regions of fin 430. In still another embodiment, a cadding may be introduced on fin 430 in designated diffusion regions to form the source 460A and drain 460B, respectively. In one embodiment, following the formation of source 460A and drain 460B in fin 430, dielectric material such as $SiO_2$ or a low-k material is formed around and on the structure.

Figure 7:
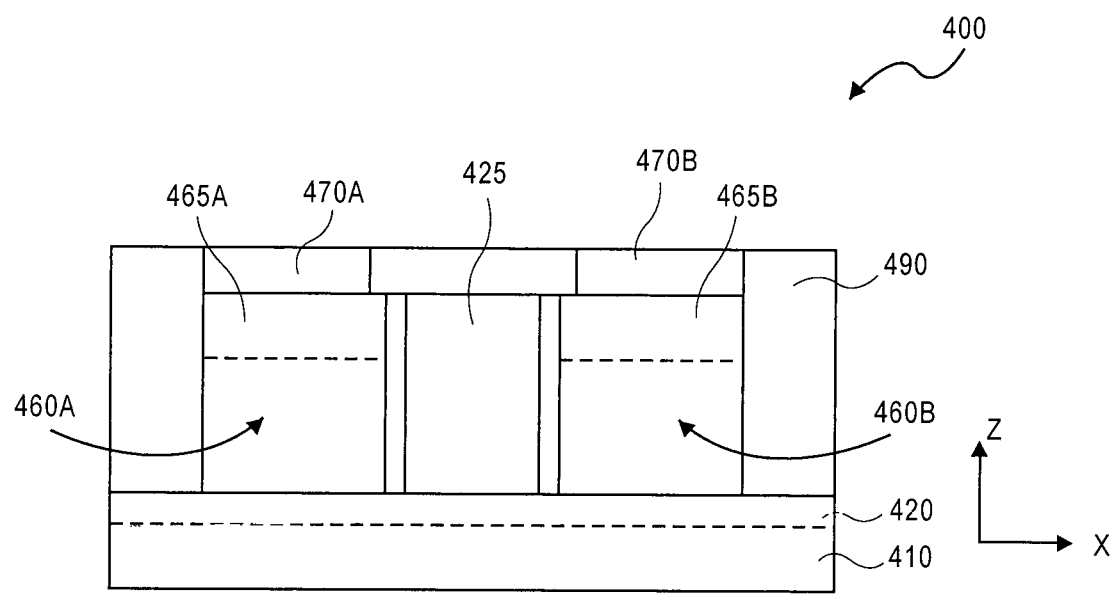
FIG. 7 shows a cross-sectional side view of the structure of FIG. 6 through line 6-6' and following the introduction of metallization on the source and drain and the forming of an intra-level interconnect to each metallization.

FIG. 7 shows a cross-sectional side view of the structure of FIG. 6 through line 6-6' and following the introduction of metallization on the source and drain of the transistor device and the forming of an intra-level interconnect to each metallization. Referring to FIG. 7, in one embodiment, structure 400 includes source metallization 465A on source 460A.

In one embodiment to form source metallization and drain metallization, source 460A and drain 460B are exposed through dielectric material 490. In one embodiment, source 460A and drain 460B (see FIG. 6) can be exposed through dielectric 490 by a mask and etch process such as forming a mask over a surface of dielectric layer 490 with openings corresponding to areas for the metallization and etching through the openings and then removing the mask. Source metallization 465A and drain metallization 465B is formed of, in one embodiment, a metal material such as tungsten or other metal that is deposited by, for example, atomic layer deposition to contact opposing sides and a top surface as viewed of source 460A and drain 460B, respectively. Following the formation of source metallization 465A and drain metallization 465B interconnects may optionally be formed to the respective metallization. FIG. 7 shows interconnect 470A connected to source metallization 465A and extending orthogonally therefrom (into or out of the paper) and interconnect 470B connected to drain metallization 456B and likewise extending orthogonally therefrom. In one embodiment, interconnect 470A and interconnects 470B are an electrically conductive material such as copper that is introduced by an electroplating deposition process.

A device formed on substrate 410 such as the transistor device including the placeholder gate described may represent one of many devices formed on substrate 410, some possibly including placeholder gates and others, should they be multi gate devices, may have such placeholder gates replaced with a desired material gate stack. The devices formed on substrate 410 represent a first device stratum or first transistor level such as device stratum 110 shown in FIGS. 1 and 2.

Figure 8:
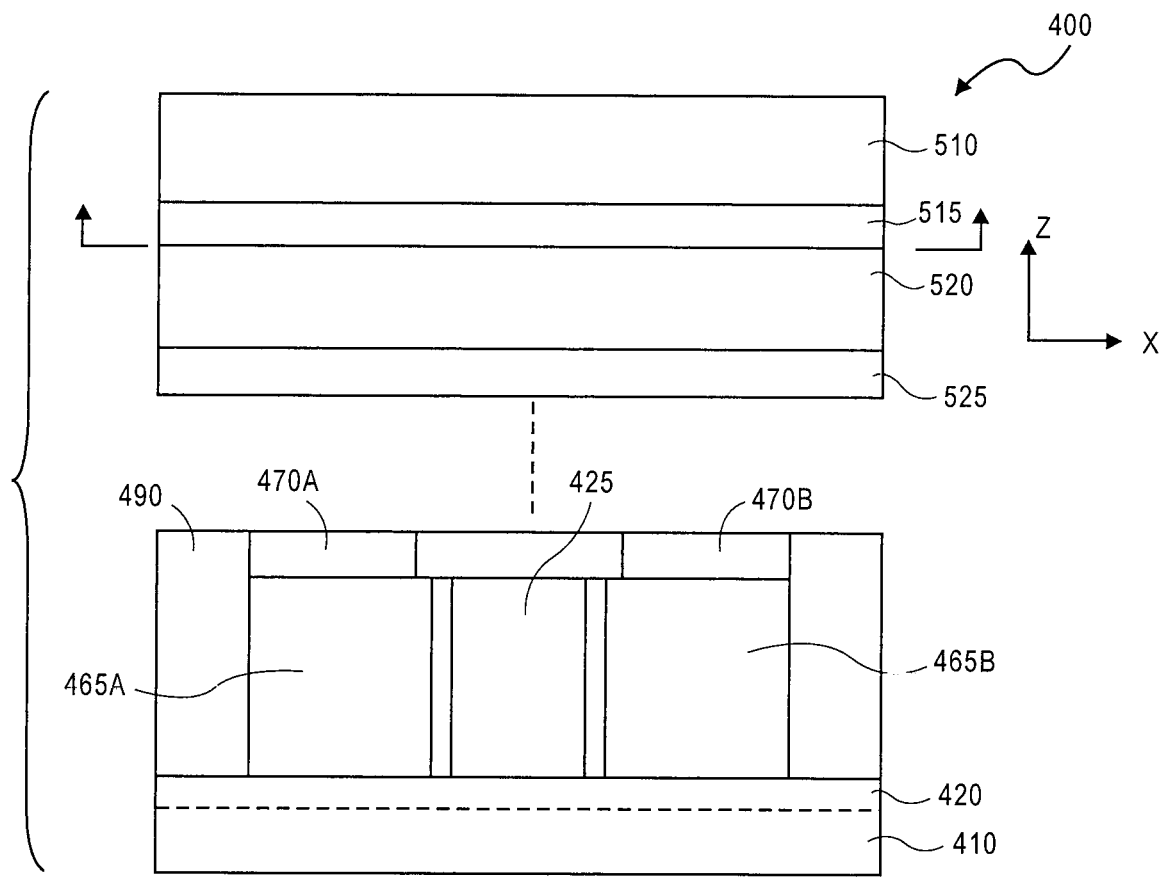
FIG. 8 shows a connection of a donor substrate to a host substrate.

Having formed a first device stratum, a method or process proceeds to the formation of a second device stratum or transistor level on the first device stratum. While there are many suitable techniques, one example entails transferring a semiconductor layer of an SOI substrate onto a host substrate on which the first device stratum is disposed (onto substrate 410). The transfer may entail forming an oxide on a surface of the SOI layer, compression bonding the oxide surface to an intra-level dielectric covering the first device stratum and removing the donor substrate from the SOI layer, for example, at a buried oxide layer, etc. Noting that there are other methods as well, embodiments are not limited in this respect. Referring again to the Figures, FIG. 8 shows a connection of a donor substrate to a host substrate. In this embodiment, host substrate is defined by substrate 410 and the device stratum formed on a surface thereof to include a P-type transistor with a dummy or sacrificial gate stack as well as source and drain metallization and intra-level interconnects 470A and 470B to the source and drain metallization, respectively. FIG. 7 shows donor substrate 510 that is, for example, a semiconductor substrate having insulator or dielectric layer 515 of, for example, an oxide (e.g., $SiO_2$) disposed between a semiconductor layer 520 and the bulk substrate 510. In one embodiment, substrate layer 520 is a monocrystalline silicon, germanium or other semiconductor. In one embodiment, dielectric layer 525 such as an oxide is formed (e.g., grown) on a surface of dielectric layer 520 to complete the donor substrate. The donor substrate is bonded to the host substrate by, for example, compression bonding or thermal bonding of the dielectric surfaces (dielectric layer 490 of host and dielectric layer 525 of donor). Following bonding, the donor substrate may be separated at dielectric layer 515 leaving semiconductor layer 520 as a superior surface of the combined host substrate and donor layer. Following the transfer, semiconductor layer 520 may be thinned such as by a mechanical polish or grinding process.

Figure 9:
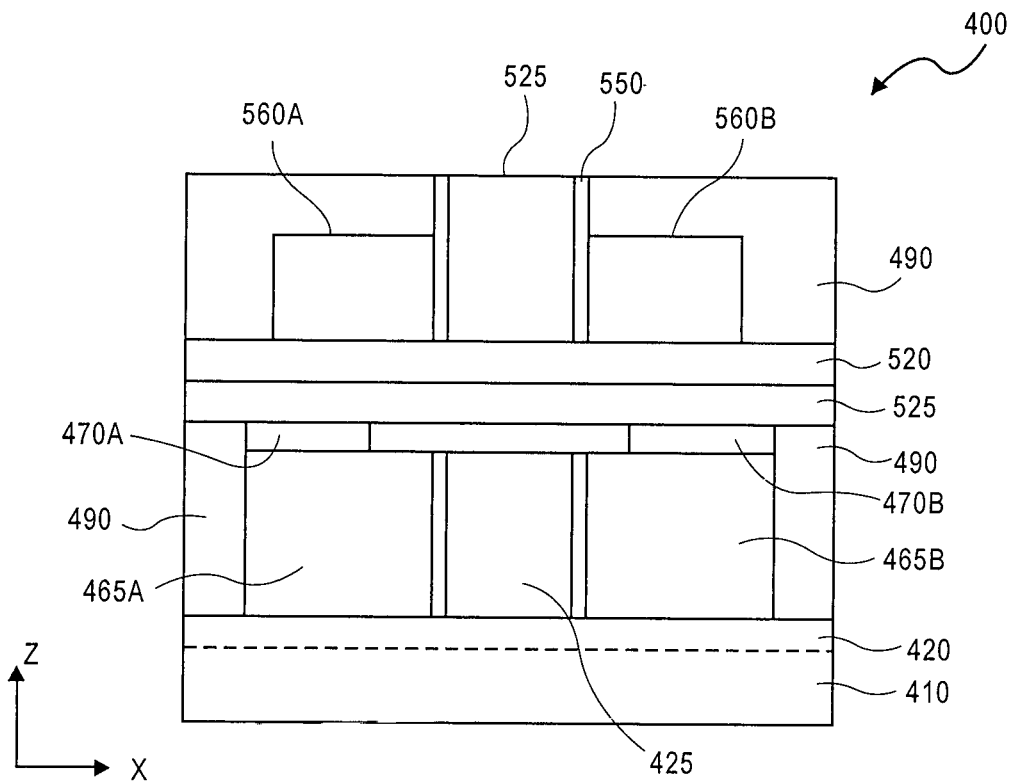
FIG. 9 shows the structure of FIG. 8 following the fabrication of a portion of a semiconductor body or fin for a transistor device on a second device stratum and a placeholder gate stack on the body and a source and a drain region in diffusion regions of the fin.

FIG. 9 shows the structure of FIG. 8 following the fabrication of a portion of a transistor device on semiconductor layer 520. In one embodiment, a three-dimensional transistor or finFET is formed in the second device level similar to the first device level. In such case, a portion of semiconductor layer 520 may be used in forming the fin of such device. FIG. 9 shows the transistor including source 560A and drain 560B formed in or on the fin and sacrificial, dummy or placeholder gate 525 formed and underlying dielectric layer formed on the fin in a channel region between source 560A and drain 560B. FIG. 9 also shows sidewall spacers 550 on opposite sides of placeholder gate 525. In one embodiment, source 560A and drain 560B are formed to be of an N-type. Accordingly, source and drain may be formed as described above with respect to source 560A and source 560B and doped with an N-type dopant such as arsenic or phosphorous. Disposed on and over the transistor in FIG. 9 is dielectric layer 490 of silicon dioxide or a low-k dielectric material or a combination of silicon dioxide or low-k materials. In FIG. 9 the sacrificial or dummy gate 525 is exposed through the dielectric material.

Figure 10:
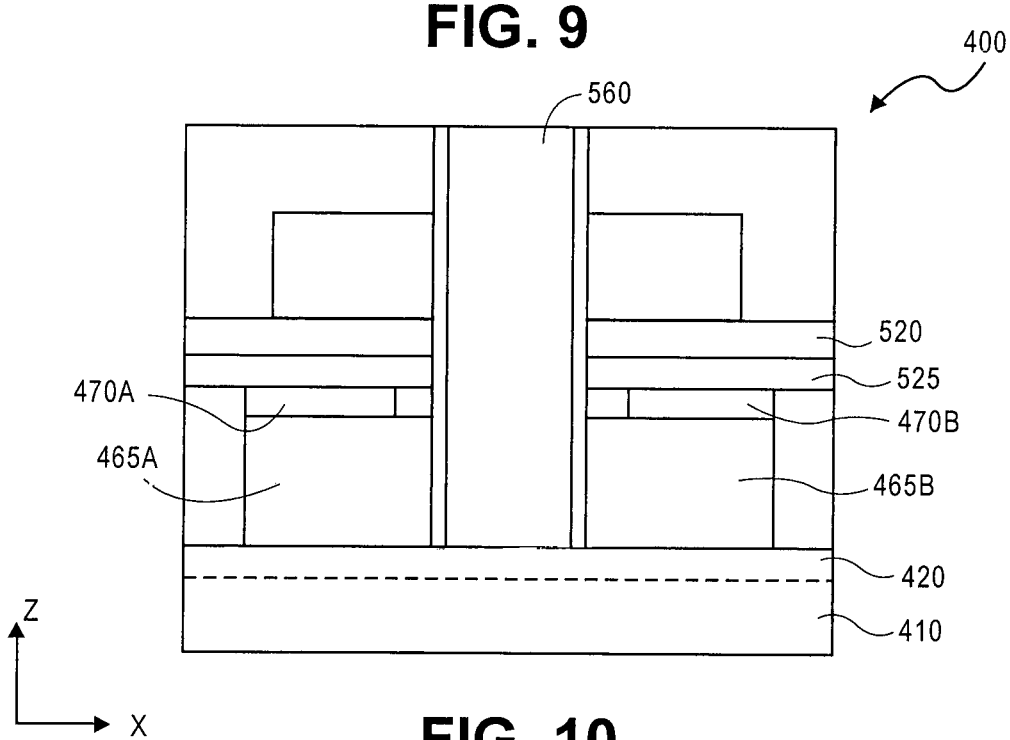
FIG. 10 shows the structure of FIG. 9 following the replacement of the placeholder gate stack of the transistor on each strata of the structure and replacement of the placeholder gate stack with a common gate stack.

FIG. 10 shows the structure of FIG. 9 following the replacement of the placeholder gate stacks of the transistor on each strata of the structure and replacement of the placeholder gate stacks with a common gate stack. The removal of placeholder gate stack on each level in one embodiment involves an inter-level etch. First, the dielectric material (e.g., dielectric layer 490 and spacers 550) is protected by a mask. An etch then proceeds through placeholder gate 425 and the underlying gate dielectric material on the semiconductor body or fin portion on the second device stratum, then through semiconductor layer 520 and dielectric layer 525 from the donor substrate then through dielectric layer 490 of the first device stratum and finally through placeholder gate 425 and the underlying gate dielectric of the first device stratum. In one embodiment, such an inter-level etch may be performed by any high aspect ratio etch tuned to have a selectivity favoring the target film composition over the channel region (e.g., polysilicon, dielectric material). Following the removal of the placeholder gate stacks, a single gate stack is formed on the devices of each level. FIG. 10 shows a single gate stack including gate electrode 560 that overlies and a gate dielectric such as a silicon dioxide or high-k dielectric material or combinations of either silicon dioxide and a high-k material or two or more high-k materials. Gate electrode 560 in one embodiment, is a metal such as tungsten, tantalum or a metal silicide.

Figure 11:
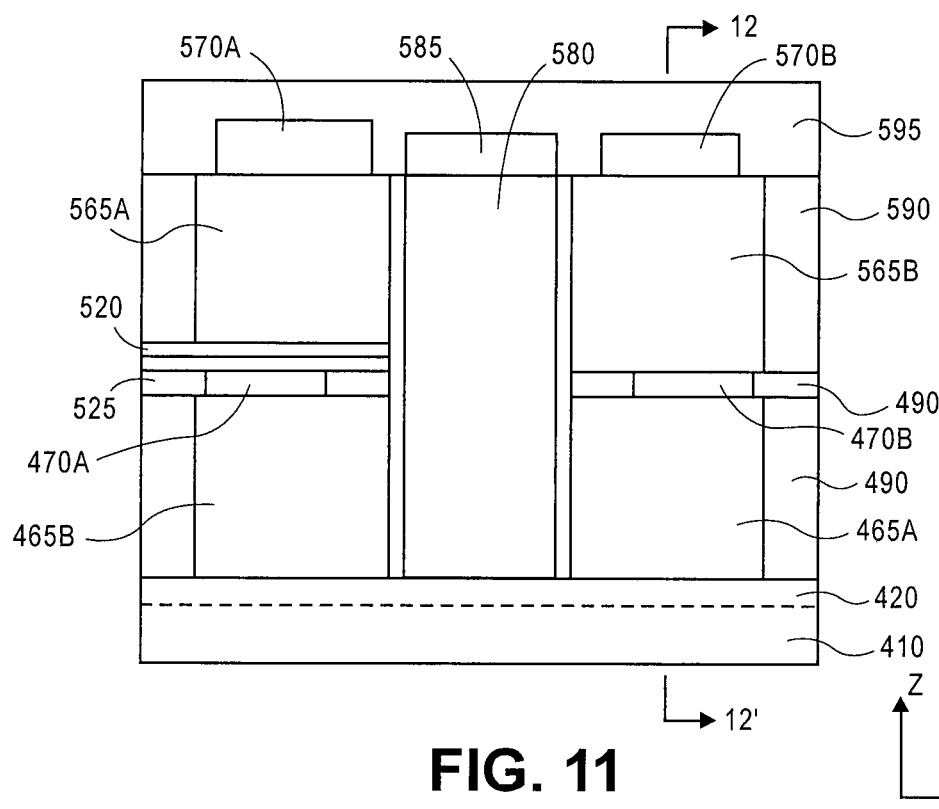
FIG. 11 shows the structure of FIG. 10 following the metallization of the source and drain diffusion regions of the transistor in the second device stratum and connection of the drains of the device in each stratum.
Figure 12:
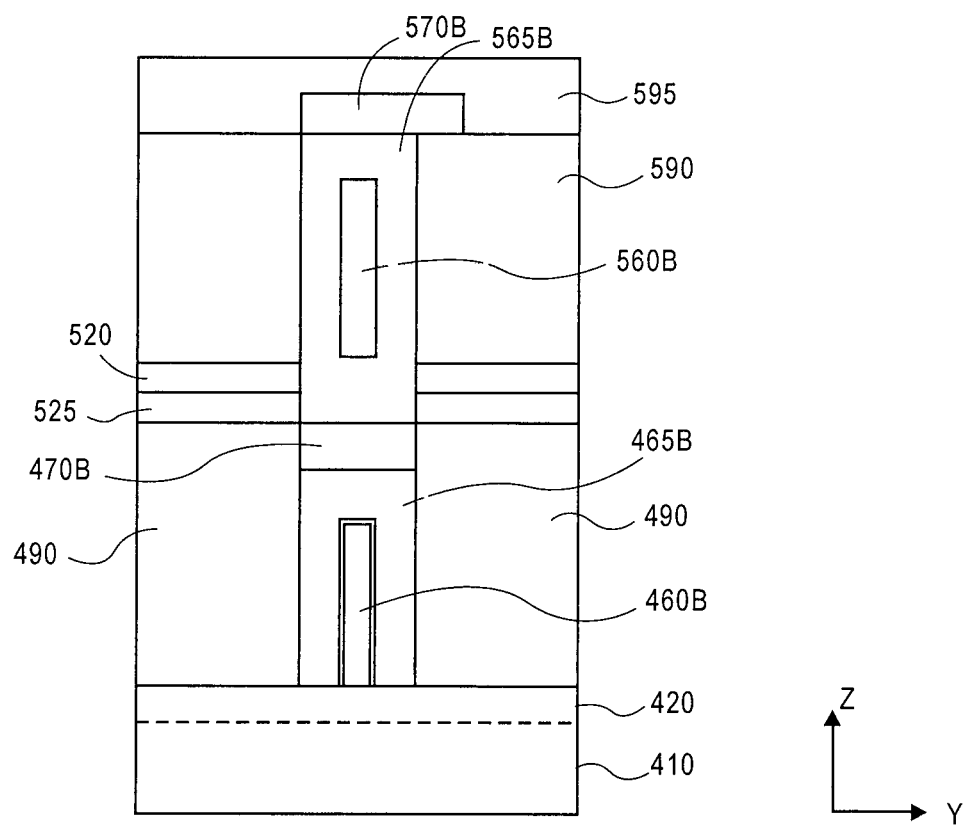
FIG. 12 shows a cross-section through line 12-12' of FIG. 11 and shows a drain metallization contacting a drain and extending to a contact intra-level interconnect that is itself connected to the drain metallization of the transistor of the first device stratum.

FIG. 11 shows the structure of FIG. 10 following the metallization of the source and drain diffusion regions of the transistor in the second device stratum and connection of the drains of the device in each stratum. The metallization of source 560A and 565B may be achieved by forming an opening in dielectric layer 590 surrounding the respective source and drain, protecting the structure with a mask and then depositing an electrically conductive material such as tungsten or copper. In forming the metallization for source, dielectric layer 590 is etched to a depth representatively of source 560A. In one embodiment, the drain metallization is deeper than a source metallization. Initially, an opening is made through dielectric layer 590 through the length of drain 560A then through substrate 520 and dielectric layer 525 to interconnect 470B of the first device stratum. Following the formation of the openings exposing source 360A and drain 560B, metallization may be deposited in the openings with a desired metal such as tungsten or copper (e.g., atomic layer deposition, plating, etc.). FIG. 11 shows source metallization 565A on source 560A and drain metallization 565B on drain 560B. FIG. 12 shows a cross-section through line 12-12' of FIG. 11 and shows drain metallization 565B contacting drain 560B and extending to contact intra-level interconnect 470B that is itself connected to drain metallization 465B of the transistor of the first device stratum. Drain metallization 565B is an inter-strata metallization or contact.

Following a formation of the source and drain metallization, FIG. 11 shows the structure after forming intra-level interconnects to the gate electrode and source and drain metallization. FIG. 11 shows interconnect 570A connected to source metallization 565A, interconnect 570B connected to drain metallization 565B and interconnect 585 connected to the gate electrode 580. Each interconnect may be selected of an electric conductive material and formed as known in the art such as copper formed by an electroplating process. The interconnects may then be insulated with dielectric material. FIGS. 11 and 12 show dielectric material 595 such as a low-k dielectric material or materials introduced on a surface of the structure (upper surface) to insulate the intra-level interconnects. The resulting structure resembles that of FIG. 1 and FIG. 2 described above.

The above process and description described an integrated circuit including a first transistor in or on a first device stratum and a second transistor in or on a second device stratum and the transistors electrically connected and sharing a common gate electrode. The example of an inverter was described. In one embodiment, such different strata or "stacked" transistors are used to implement dynamic logic by compressing a P-precharge transistor and an N-evaluate transistor in different strata and sharing a common gate. A CMOS inverter (or nand or nor) incorporated into the dynamic logic circuit can also use the stacked transistor/common gate to save area.

In the above embodiment, a common gate electrode is implemented by a gate electrode going through two device strata. In another embodiment, individual gate electrodes may be formed to two and then connected such as by an inter-strata metallization or contact similar to metallization 565B described above.

Figure 13:
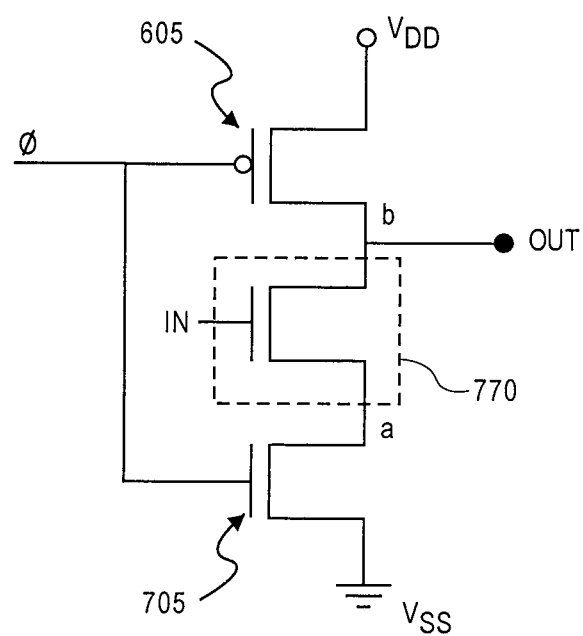
FIG. 13 shows a circuit diagram of a simple dynamic logic circuit.

FIG. 13 shows a circuit diagram of a simple dynamic logic circuit. FIG. 13 shows P-type precharge transistor 605 and N-type evaluate transistor 705 with a clock signal, φ connected to a gate of each transistor. One diffusion region (e.g., a source) of the P-type transistor is connected to $V_{DD}$ and the other (e.g., a drain) connected to an output. Also connected to the output is block 770 typically of one or more N-type transistors. In FIG. 13, one N-type transistor is shown. An input is connected to block 770 (connected to a gate of the N-type transistor) and one diffusion of the N-type transistor of block 770 is connected to N-type transistor 705. As described the clock signal is connected to the gate of P-type prechard transistor 605 and the gate of N-type evaluate transistor 705. Accordingly, transistor 605 and transistor 705, in one embodiment, can be arranged in a three-dimensional configuration with one device in a first device stratum or level and the other in a second device stratum of an integrated circuit structure. In another embodiment, transistor 605 and transistor 705 can share a common gate as described above with respect to the inverter example.

Figure 14:
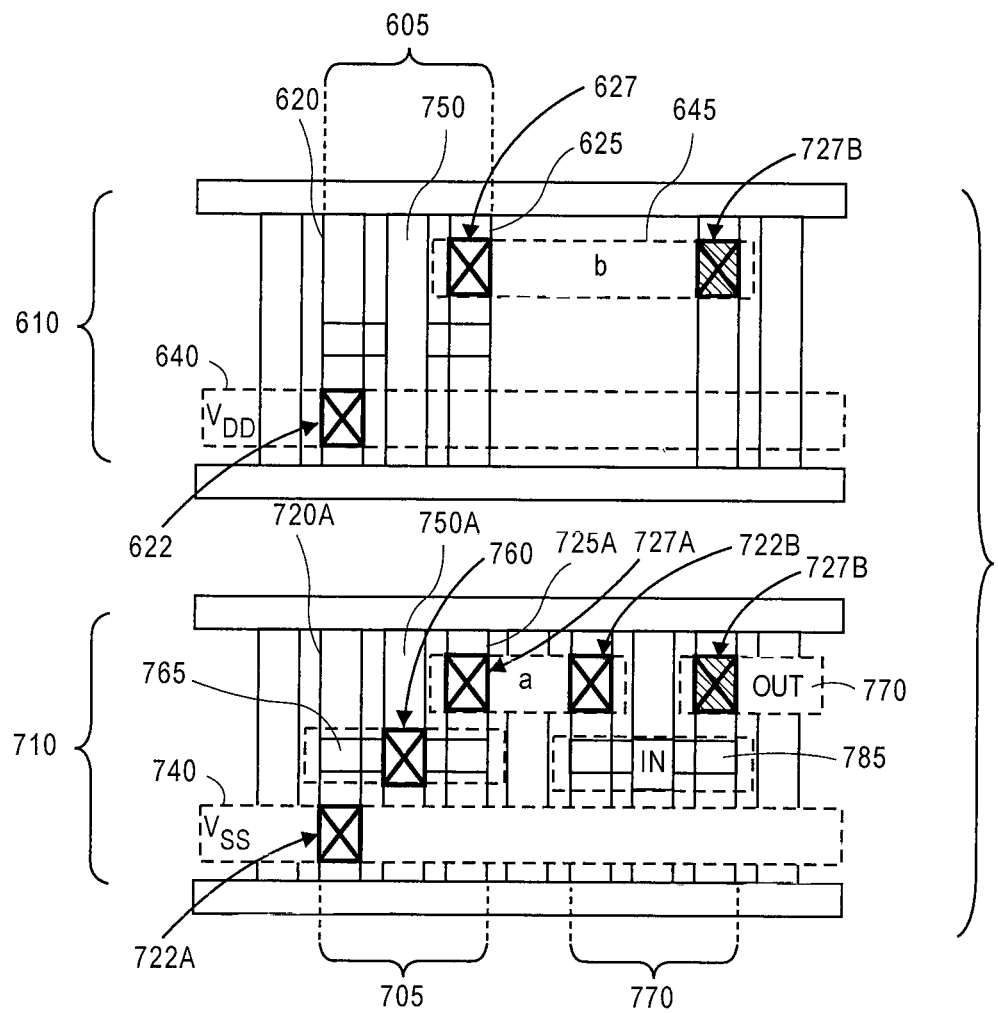
FIG. 14 shows a schematic cell layout of a first device stratum or level and a second device stratum or level implementing the dynamic logic circuit shown in FIG. 13.

FIG. 14 shows a planar diagram of a first device stratum or level and a second device stratum or level implementing the dynamic logic circuit shown in FIG. 13 where the P-type precharge transistor and the N-type evaluate transistor are in different strata and share a gate electrode. In one embodiment, first device stratum 610 is directly below (in a z-dimension) second device stratum 710. FIG. 14 shows first device stratum 610 includes the P-type device (device 605) in FIG. 13 and device stratum 710 includes the N-type device (device 705). FIG. 14 also shows a second N-channel device in device stratum 710, the second device reflecting block 770 in FIG. 13.

Figure 15:
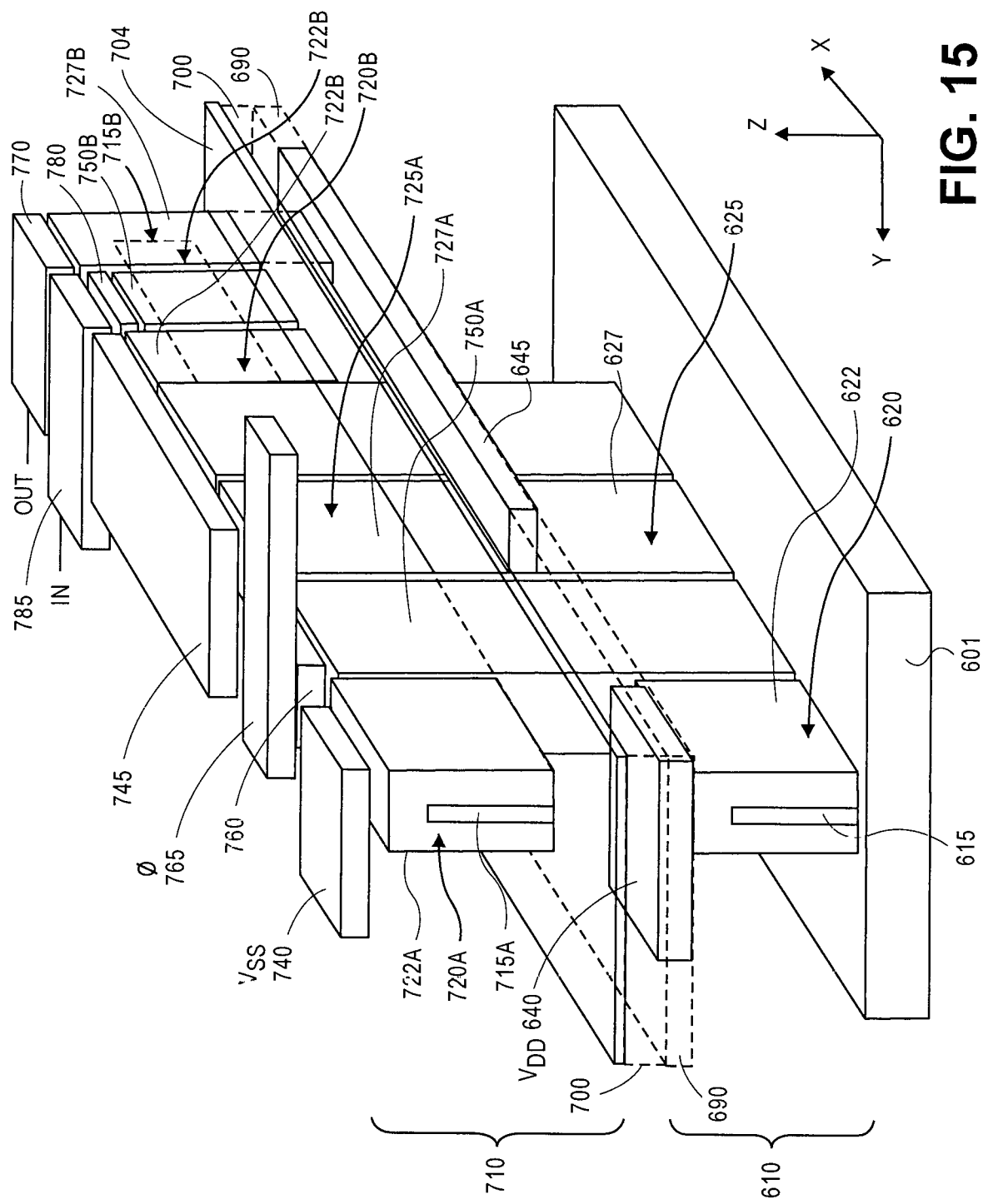
FIG. 15 shows a top side perspective view of a three-dimensional integrated circuit structure including two device strata implementing the dynamic logic circuit described with reference to FIG. 13 and FIG. 14.

FIG. 15 shows a top side perspective view of a three-dimensional integrated circuit structure including two device strata implementing the dynamic logic circuit described with reference to FIG. 13 and FIG. 14. Referring to FIG. 15, the structure includes base substrate 601 of, for example, a semiconductor or SOI substrate. Disposed on substrate 601 is device stratum 610 and disposed on device stratum 610 is device stratum 710. The device strata, in one embodiment, are formed as described above with respect to FIGS. 5-12. Referring to FIG. 15, device stratum 610 includes semiconductor body 615 extending laterally over an area of substrate 601 (e.g., a surface of substrate 601). Device stratum 710 includes semiconductor body 715A aligned, in a z-dimension with semiconductor body 615 of device stratum 610. Device stratum 710 also includes semiconductor body 715B laterally disposed in an x-dimension from semiconductor body 715A. Each of semiconductor body 615, semiconductor body 715A and semiconductor body 715B are fins though alternate embodiments are also possible (e.g., planar, nanowire or combinations).

Referring again to device stratum 610 and semiconductor body 615, the semiconductor body includes diffusion regions representatively designated as source 620 and drain 625 separated by a channel region surrounded by gate stack 750A. In one embodiment, source 620 and drain 625 are P-type diffusion regions. Disposed on source 620 is metallization 622 and on drain 625 is metallization 627, each metallization of a metal such as tungsten or other metal or metal compound. Connected to metallization 622 is electrically conductive interconnect 640 and connected to metallization 627 is interconnect 645. A representative material for interconnect 640 and interconnect 645 is copper. Intralevel dielectric layer 690 is adjacent interconnect 640 and interconnect 645. Semiconductor body 715A of device stratum 710 includes diffusion regions representatively designated as source 720A and 725A. In one embodiment, source 720A and drain 725A are N-type diffusion regions. Disposed on a surface of source 720A is metallization 722A and disposed on drain 725 is metallization 727A, each metallization of a material such as tungsten of metal or metal compound. FIG. 15 shows interconnect 740 connected to metallization 722A and interconnect 745 connected to metallization 727A. A representative material for such interconnects is copper.

As illustrated in FIG. 15, the device defined by semiconductor body 615 in device stratum 610 shares a common gate electrode with the device defined by semiconductor body 715A in device stratum 710. In one embodiment, a gate dielectric such as silicon dioxide and/or a high-k dielectric material or materials is disposed on semiconductor body 715A and semiconductor body 615 and gate electrode 750A of, for example, a metal or silicide is formed on a channel region of semiconductor body 715A and on a channel region of semiconductor body 615. The gate stack (gate dielectric and gate electrode) 750A disposed on semiconductor body 715A (over a channel region) and extends through substrate 704, through interlevel dielectric layer 700, through intralevel dielectric layer 690 to first device stratum 610 where it is disposed on semiconductor body 615 (over a channel region). FIG. 15 shows gate electrode metallization 760 of a metal such as tungsten connected to gate electrode 750A and interconnect 765 of a material such as copper connected to gate electrode metallization 760.

Semiconductor body 715B on device stratum 710 includes N-type diffusion regions 720B and 725B with metallization 722B and 727B, respectively formed thereon. FIG. 15 shows interconnect 770 connected to metallization 727B and interconnect 745 connected to metallization 722B. As noted, a material for such interconnects in one embodiment is copper. Disposed on a channel region of semiconductor body 715 is a gate stack including a gate dielectric (SiO$_2$ and/or a high-K material) and an gate electrode 750B of, for example, a metal or a silicide. The gate stack is over a channel region of semiconductor body 715B. Connected to gate electrode 750B is metallization 780 of, for example, tungsten or copper and connected to metallization 780 is interconnect 785 of, for example, copper.

FIG. 15 shows the implementation of the dynamic logic circuit described with reference to FIG. 13 and FIG. 14. Specifically, FIG. 15 shows a clock signal, φ, at interconnect 765 that is connected to a shared gate electrode of an N-type device defined by semiconductor body 715A in device stratum 710 and a P-type device defined by semiconductor body 615 in device stratum 610.

FIG. 15 shows that the P-type device defined by semiconductor body 615 includes interconnect 640 connected to V$_{DD}$ and interconnect 645 connected to a diffusion region of the N-type transistor device defined by semiconductor body 715B (connected to diffusion region 725B through metallization 727B). Metallization 727B is, in this embodiment, is an inter-strata metallization or contact that extends through device stratum 710, through substrate base 704 through inter-dielectric layer 700 to interconnect 645 that is connected to drain metallization 627 and drain 625 of the P-type transistor device represented by semiconductor body 615 in device stratum 610. Referring to the N-type device defined by semiconductor body 715A in device stratum 710, FIG. 15 shows interconnect 740 connected to source metallization 722A connected to V$_{SS}$ and interconnect 745 to drain metallization 725A connected to a diffusion region of the N-type device defined by semiconductor body 715B (connected to metallization 722B on diffusion region 720B). Finally, FIG. 15 shows interconnect 785 connected to gate electrode 750B of the N-type device defined by 715B. Interconnect 785 is connected to an input and interconnect 770 connected to diffusion region 725B of the N-type device is connected to an output.

Figure 16:
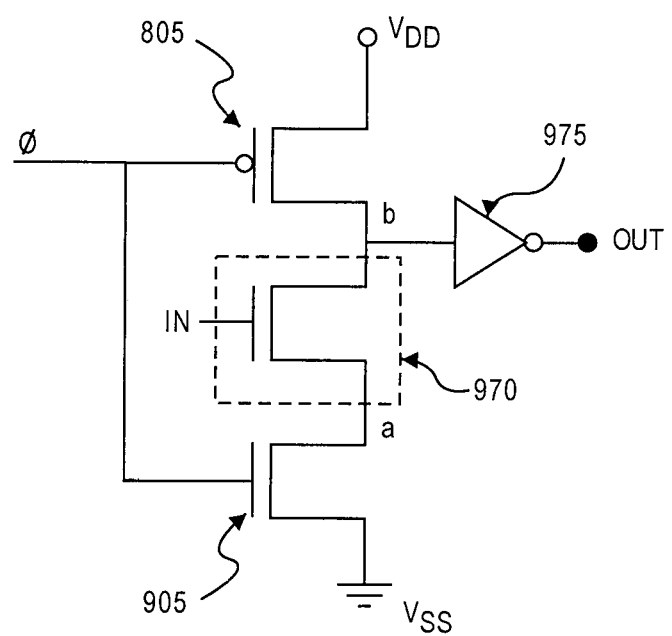
FIG. 16 shows a circuit diagram of another embodiment of a dynamic logic circuit with an inverter at the output.

FIG. 16 shows a circuit diagram of another embodiment of a dynamic logic circuit. In this embodiment, the logic circuit includes restoring logic in the form of an inverter at the output. Restoring logic is generally utilized to ensure that subsequent dynamic stages of a larger circuit do not see a 1 to 0 transition after a pre-charge pulls an output to 0. By adding an inverter at the output, the precharge phase will always be 0 when the precharge node is set to 1.

FIG. 16 shows P-type transistor 805 and N-type transistor 905 with a clock signal, φ, connected to a gate of each transistor. A source of P-type transistor 805 is connected to V$_{DD}$ and a drain is connected to an output. Also connected to the output is block 970 of one or more N-type transistors (one shown). An input is connected to block 770 (to one diffusion region of the N-type transistor) and another diffusion region from block 970 is connected N-type transistor 905. The logic circuit also includes inverter 975 at the output.

Figure 17:
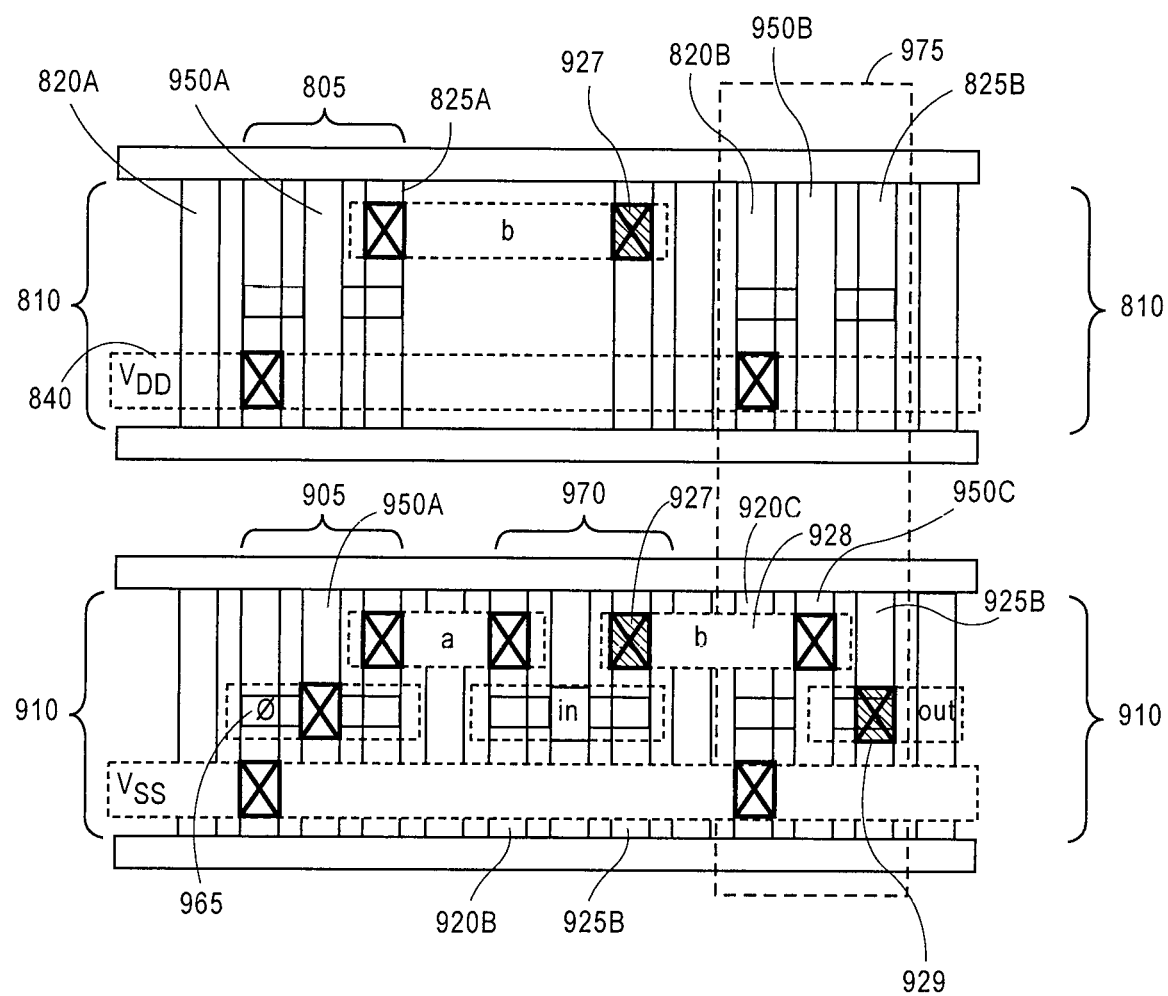
FIG. 17 shows a schematic cell layout of a first device stratum and a second device stratum of a structure implementing the dynamic logic circuit shown in FIG. 16.

The dynamic logic circuit described with respect to FIG. 16 may be implemented in two device strata where ones of devices in such strata share a common gate electrode. FIG. 17 shows a first device stratum and a second device stratum of an integrated circuit structure implementing the dynamic logic circuit shown in FIG. 16. In one embodiment, first device stratum 810 is directly below (in a z-dimension) second device stratum 910. FIG. 17 shows first device stratum 810 includes P-type transistor 805 identified in FIG. 16 and device stratum 910 includes N-type transistor 905 identified in FIG. 16 with P-type transistor 805 and N-type transistor sharing common gate electrode 950A. Device stratum 910 also includes the N-type transistor in block 970. In one embodiment, inverter 975 includes a P-type transistor and an N-type transistor in separate device strata sharing common gate electrode 950B. Representatively, FIG. 17 shows a first transistor (e.g., P-type transistor) of inverter 975 in device stratum 810 and a second transistor (e.g., an N-type transistor) of the inverter in device stratum 910. The assembly of transistors in FIG. 17 is similar to a combination of the embodiment described with respect to FIGS. 1-4 and FIGS. 13-15. FIG. 17 shows common gate electrode 950A connected to P-type transistor 805 in device strata 810 and N-type transistor 905 in device stratum 910. Clock signal 965, φ, is connected to gate electrode 950A. FIG. 17 shows source 820A of P-type transistor 805 connected to intralevel interconnect 840 to V$_{DD}$ and drain 825A connected to an output of the logic circuit. The N-type transistor of block 970 includes a diffusion region that is also connected to the output. FIG. 17 shows contact 927 (e.g., an interlevel metallization) connecting drain 825A of P-type transistor 805 and diffusion region 925B of an N-type transistor of block 970. On device stratum 910 is interconnect 928 extending between contact 927A and gate electrode 950C of inverter 975. Inverter 975 includes, in this embodiment, a P-type transistor in device stratum 810 and an N-type transistor in device stratum 910. Source 820B of the P-type device is connected to intralevel interconnect 840 to V$_{DD}$ and drain 825B is connected to an output through contact 929 (an interlevel metallization). The N-type device of the inverter in device stratum 910 includes source 920C connected to an output and drain 925C connected to $V_{SS}$.

The dynamic logic circuit described above takes a total of three gate electrode tracks for the dynamic inverter (one P- and two N-type devices) plus two gate electrode tracks for a full complementary metal oxide semiconductor (CMOS) inverter. The savings with dynamic logic comes in an improvement of a speed of evaluation by building only one half of the logic.

Figure 18:
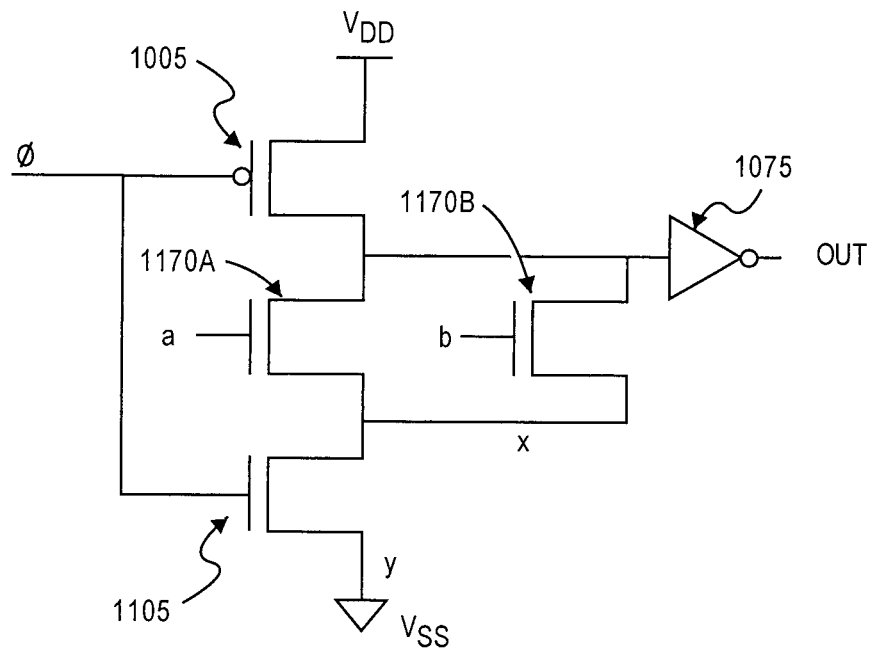
FIG. 18 shows a circuit diagram of a dynamic NOR gate.

FIG. 18 shows a circuit diagram of a dynamic NOR gate. Similar to the logic circuits described above, logic circuit 1000 can be implemented in two device strata and provides the opportunity of sharing a gate electrode by compressing the P-type pre-charge transistor and the N-type evaluate transistor. The circuit also includes restoring logic in the form of an inverter at the output where the P-type transistor and the N-type transistor of the inverter, in one embodiment, are in different device strata and share a gate electrode.

Figure 19:
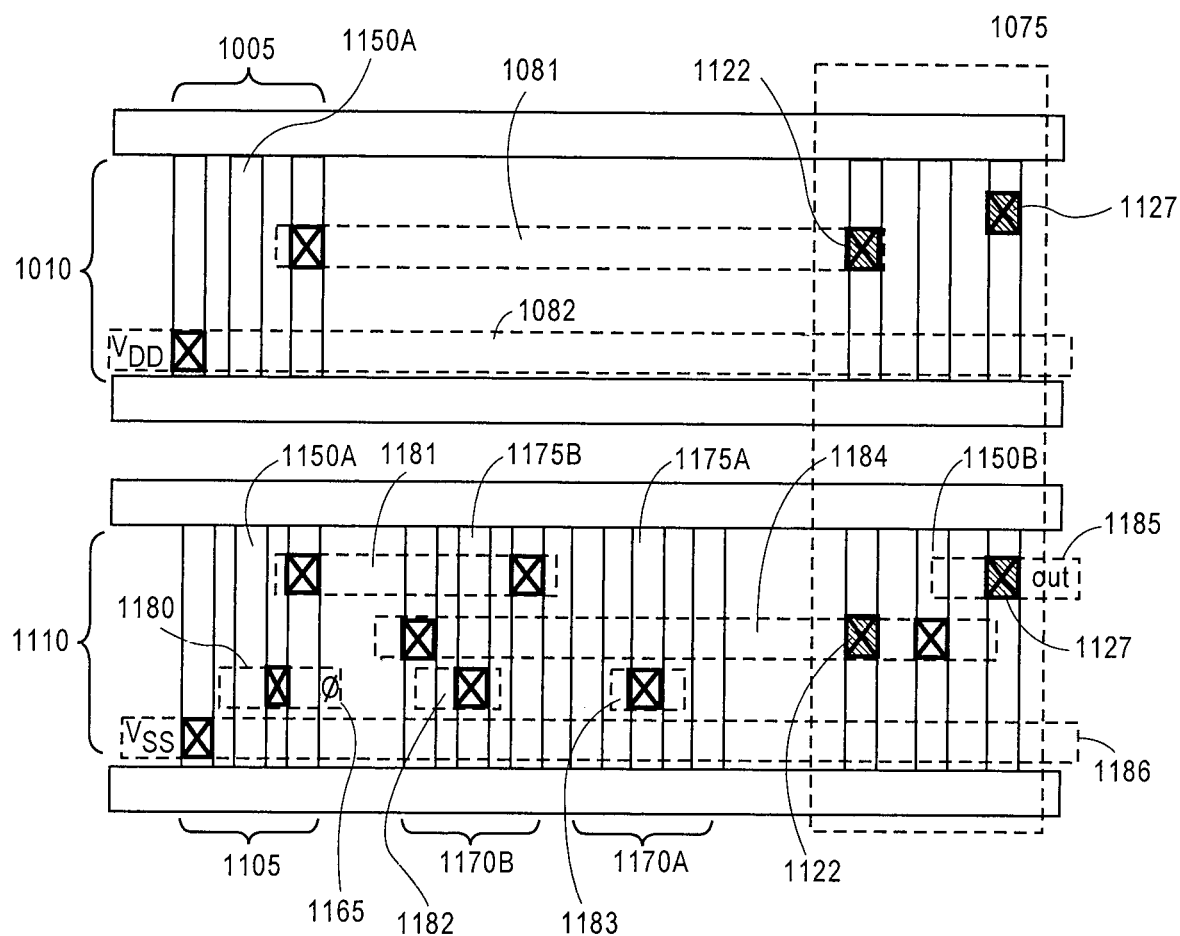
FIG. 19 shows a schematic cell layout of a first device stratum and a second device stratum of a structure implementing the dynamic logic circuit shown in FIG. 18.

The dynamic logic circuit described with respect to FIG. 18 may be implemented in two device strata where ones of devices in such strata share a common gate electrode. FIG. 19 shows a first device stratum and a second device stratum of an integrated circuit structure implementing the dynamic logic circuit shown in FIG. 18. In one embodiment, first device stratum 1010 is directly below (in a z-dimension) second device stratum 1110. FIG. 19 shows first device stratum 1010 includes P-type transistor 1005 identified in FIG. 18 and device stratum 1110 includes N-type transistor 1105 identified in FIG. 18 with P-type transistor 1005 and N-type transistor 1105 sharing a common gate electrode. Device stratum 1110 also includes N-type transistor 1170A and N-type transistor 1170B making up a two input NOR gate. FIG. 19 shows inverter 1075 including a P-type transistor and an N-type transistor in separate device strata sharing a common gate. Representatively, FIG. 19 shows a first transistor (e.g., P-type transistor) of inverter 1075 in device stratum 1010 and a second transistor (e.g., an N-type transistor) of the inverter in device stratum 1210. The assembly of transistors in FIG. 19, in one embodiment, is similar to a combination of the embodiment described with respect to FIGS. 1-4 and FIGS. 13-15. FIG. 19 shows common gate electrode 1150A connected to P-type transistor 1005 in device strata 1010 and N-type transistor 1105 in device stratum 1110. A clock signal, ϕ, is connected to interconnect 1180 that is connected to gate electrode 1150A (e.g., connected to metallization to gate electrode 1150A). FIG. 19 shows a source of P-type transistor 1005 connected interconnect 1082 to $V_{DD}$ and a drain connected to an inverter 1075 by interconnect 1081. The N-type transistor 1170A and N-type transistor 1170B each also include a diffusion region that is also connected to the inverter through interconnect 1184. FIG. 19 shows contact 1122 (an inter-strata contact or metallization) connecting a drain of P-type transistor 1005 and a diffusion region of N-type transistor 1170A and a diffusion region of N-type transistor 1170B. On device stratum 1210, interconnect 1184 extending between contact 1127 and gate electrode 1150B of inverter 1075. Inverter 1075 includes, in this embodiment, a P-type transistor in device stratum 1010 and an N-type transistor in device stratum 1110. A source of the P-type device is connected to $V_{DD}$ and a drain connected to an output. The N-type device of the inverter in device stratum 1110 includes a source connected to an output and a drain connected to $V_{SS}$. FIG. 19 shows contact 1127 between the drain of the P-type device of the inverter and a source of the N-type device of the inverter (an inter-strata contact). Interconnect 1185 is connected to contact 1127. Additional interconnects shown in FIG. 19 include interconnect 1181 connected between a diffusion of N-type device 1105 and a diffusion of N-type device 1170B and interconnect 1182 and interconnect 1183 connected to gate electrode 1175B and gate electrode 1175A of N-type device 1170B and 1170A, respectively, for inputs (b, a) to the respective devices.

Figure 20:
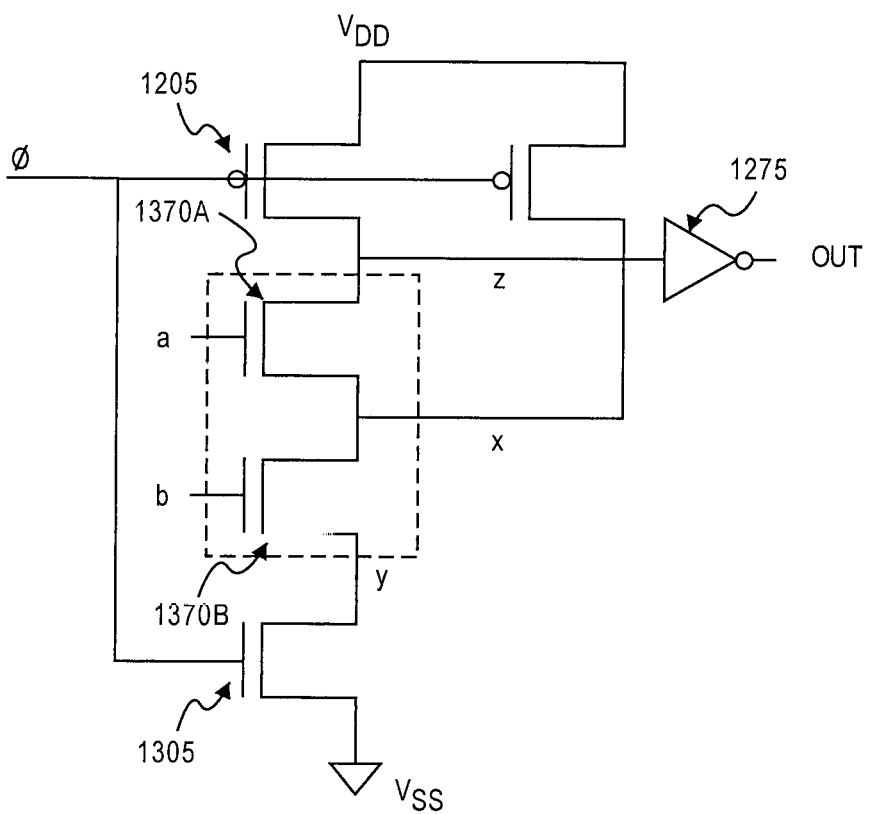
FIG. 20 shows a circuit diagram for a NAND gate logic circuit.
Figure 21:
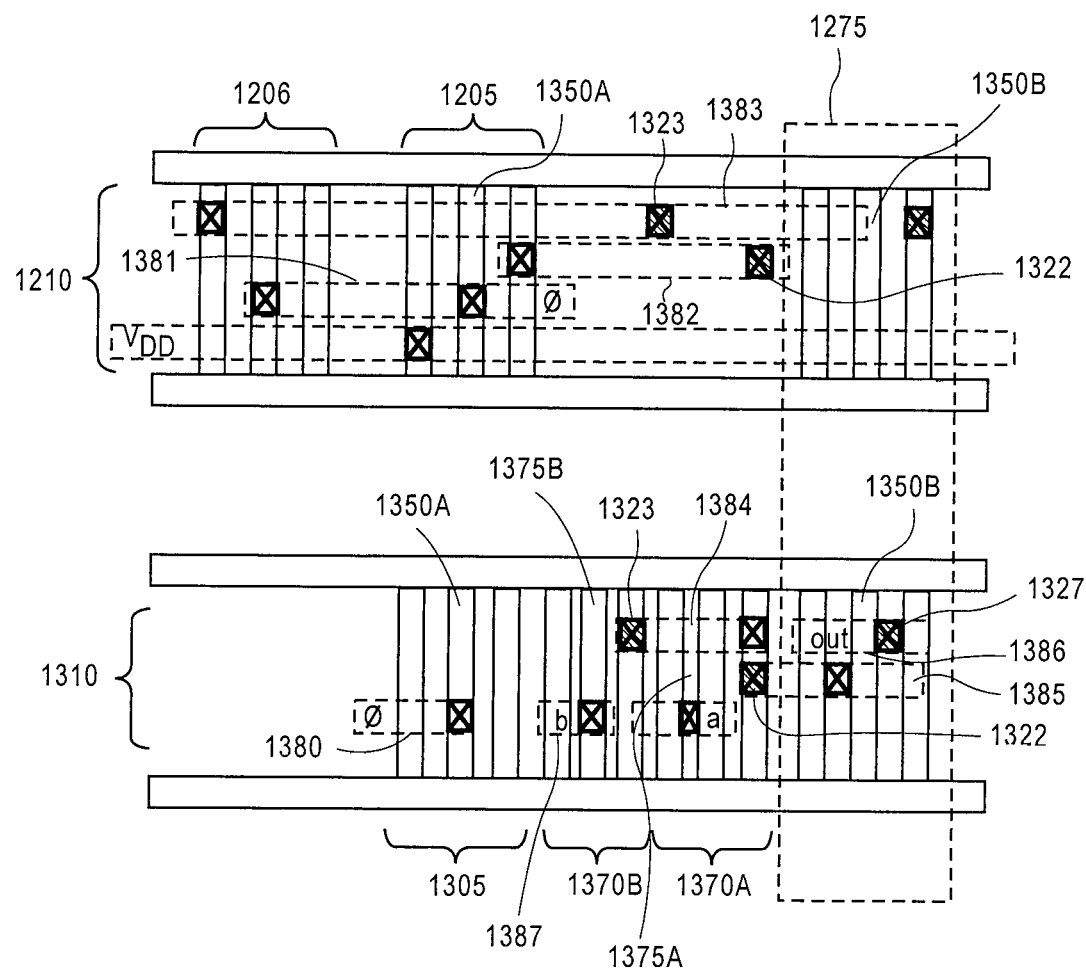
FIG. 21 shows a schematic cell layout of the circuit of FIG. 20.

FIG. 20 shows a circuit diagram for a NAND gate logic circuit that includes restoring logic in the form of an inverter at the output. FIG. 21 shows a layout of a first device stratum and a second device stratum of an integrated circuit structure implementing the dynamic logic circuit shown in FIG. 20. FIG. 20 shows P-type precharge transistor 1205 and N-type evaluate transistor 1305 with a clock signal connected to a gate of each transistor. This circuit also includes secondary P-type pre-charge transistor 1206 also connected to the clock. A source of each P-type transistor is connected to $V_{SS}$ and a drain is connected to an output. Also connected to the output is N-type transistor 1370A and N-type transistor 1370B. Transistors 1370A and 1370B have input a and input b, respectively. Diffusion regions of N-type transistors 1370A and 1370B are connected and one diffusion region is connected to the output and the other to N-type evaluate transistor 1305. The logic circuit also includes inverter 1275 at the output.

The dynamic circuit described with respect to FIG. 20 may be implemented in two device strata of an integrated circuit structure where ones of devices in such strata share a common gate electrode. FIG. 21 shows a first device stratum and a second device stratum of an integrated circuit structure implementing the dynamic logic circuit shown in FIG. 20. In one embodiment, first device stratum 1210 is directly below (in a z-dimension) second device stratum 1310. FIG. 21 shows first device stratum 1210 includes P-type precharge transistor 1205 and secondary P-type pre-charge transistor 1206 and device stratum 1310 includes N-type transistor 1305 identified in FIG. 20 where the two transistor devices share a gate electrode. Device stratum 1310 also includes the N-type transistor 1370A and N-type transistor 1370B. Finally, inverter 1275 includes, in one embodiment, a first transistor (e.g., a P-type transistor) in device stratum 1210 and a second transistor (e.g., an N-type transistor) in device stratum 1310 where the two transistors of the inverter share a gate electrode.

In one embodiment, P-type transistor 1205 and N-type transistor 1305 share a common gate electrode. FIG. 21 shows common gate electrode 1350A connected to P-type transistor 1205 in device strata 1210 and N-type device 1305 in device stratum 1310. A clock signal, ϕ, is connected to gate electrode 1350A through interconnect 1380 (the interconnect connected to metallization to the gate electrode). A gate electrode of P-type device 1206 is also connected to the clock signal through interconnect 1381. FIG. 21 shows a source of P-type transistor 1205 connected to $V_{DD}$ and a drain to a diffusion of the P-type device of inverter 1275 through interconnect 1382. The N-type transistors of block 1370 are connected in series and include a diffusion that is connected to the output.

The assembly of transistors in FIG. 21, in one embodiment, is similar to a combination of the embodiment described with respect to FIGS. 1-4 and FIGS. 13-15. FIG. 21 shows inverter 1275 including a P-type transistor in device stratum 1210 and an N-type transistor in device stratum 1310 with the transistors sharing common gate 1350B. Representatively, FIG. 21 shows a first transistor (e.g., P-type transistor) of inverter 1275 in device stratum 1210 and a second transistor (e.g., an N-type transistor) of the inverter in device stratum 1310. FIG. 21 shows contact 1322 (e.g., an inter-strata contact) connecting a drain of P-type transistor 1205 and a diffusion region of N-type transistor 1370A. FIG. 21 also shows a drain of P-type transistor 1206 connected to a diffusion of N-type device 1370B through intra-strata contact 1123 and interconnect 1384 connecting diffusions of N-type device 1370A and N-type device 1370B and interconnect 1385 between the diffusion of N-type device 1370B and gate electrode 1350B. A source of the P-type transistor is connected to $V_{DD}$ and a drain connected to an output. The N-type device of the inverter in device stratum 1310 includes a source connected to an output and a drain connected to $V_{SS}$. FIG. 21 shows inter-strata contact 1327 between the drain of the P-type device of the inverter and a source of the N-type device of the inverter. Interconnect 1386 is connected to contact 1327. Additional interconnects shown in FIG. 21 include interconnect 1387 and interconnect 1188 connected to gate electrode 1375B and gate electrode 1375A of N-type device 1370B and 1370A, respectively, for inputs (b, a) to the respective devices.

The above examples of transistor devices in different device strata sharing, in one embodiment, a common gate, demonstrates the ability for an area savings for dynamic logic as well as full rail CMOS logic.

Figure 22:
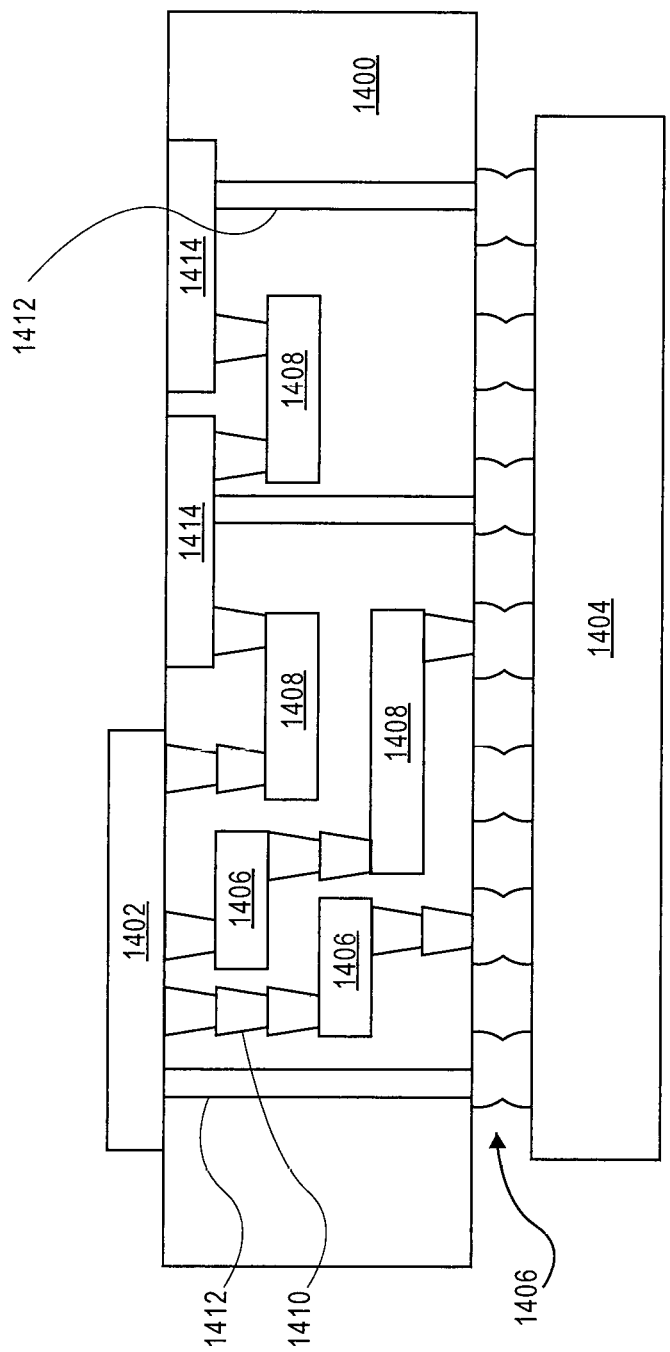
FIG. 22 is an interposer implementing one or more embodiments.

FIG. 22 illustrates interposer 1400 that includes one or more embodiments. Interposer 1400 is an intervening substrate used to bridge a first substrate 1402 to second substrate 1404. First substrate 1402 may be, for instance, an integrated circuit die that includes one or more dynamic logic circuits fabricated in accordance with techniques disclosed herein. Second substrate 1404 may be, for instance, a memory module, a computer motherboard, or another integrated circuit die that includes one or more dynamic logic circuits fabricated in accordance with techniques disclosed herein. Generally, the purpose of interposer 1400 is to spread a connection to a wider pitch or to reroute a connection to a different connection. For example, interposer 1400 may couple an integrated circuit die to ball grid array (BGA) 1406 that can subsequently be coupled to second substrate 1404. In some embodiments, first and second substrates 1402/1404 are attached to opposing sides of interposer 1400. In other embodiments, first and second substrates 1402/1404 are attached to the same side of interposer 1400. In further embodiments, three or more substrates are interconnected by way of interposer 1400.

Interposer 1400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1408 and vias 1410, including but not limited to through-silicon vias (TSVs) 1412. Interposer 1400 may further include embedded devices 1414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 1400.

In accordance with embodiments, apparatuses or processes disclosed herein may be used in the fabrication of interposer 1400.

Figure 23:
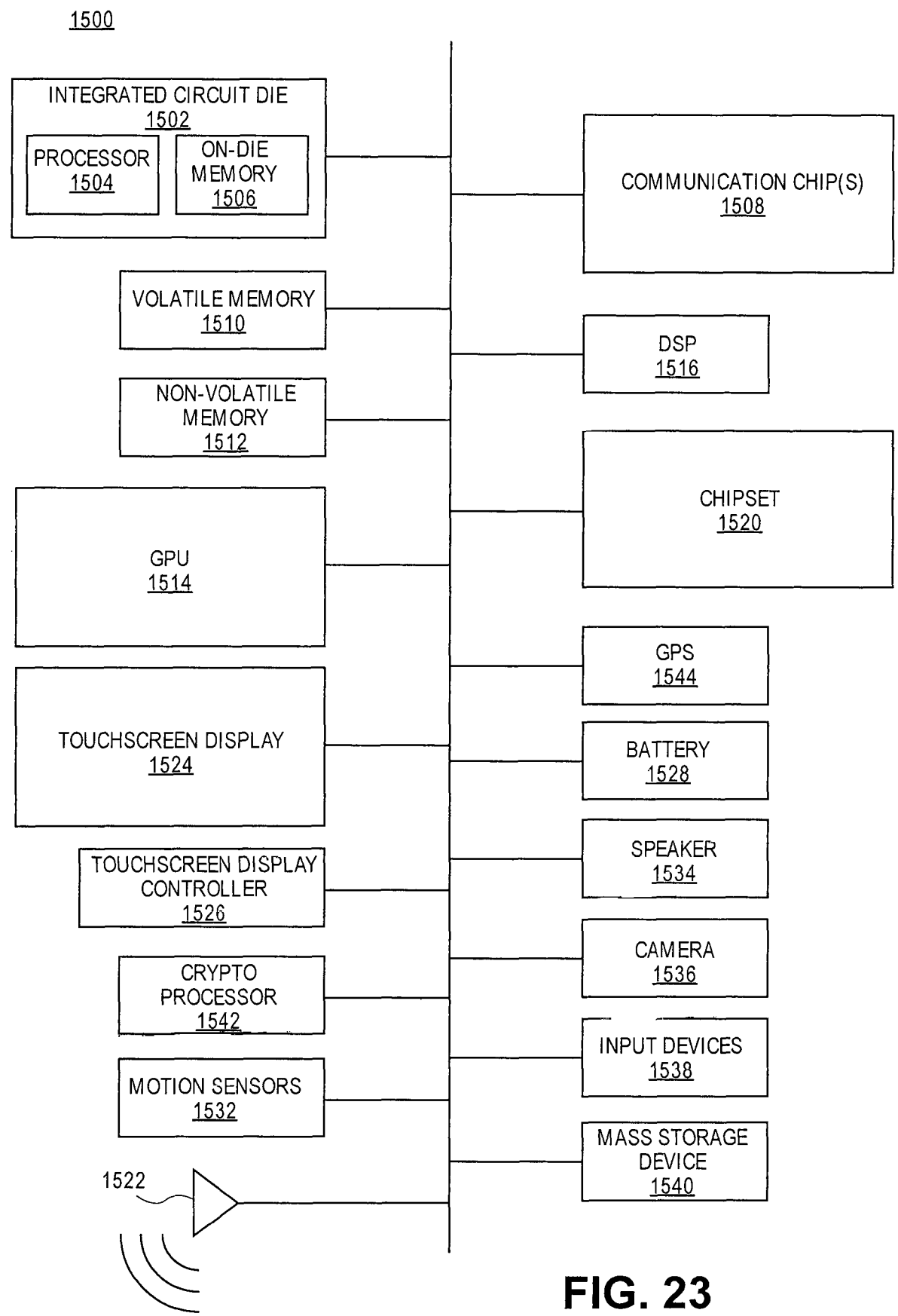
FIG. 23 illustrates an embodiment of a computing device.

FIG. 23 illustrates computing device 1500 in accordance with one embodiment. Computing device 1500 may include a number of components. In one embodiment, these components are attached to one or more motherboards. In an alternate embodiment, these components are fabricated onto a single system-on-a-chip (SoC) die rather than a motherboard. The components in computing device 1500 include, but are not limited to, integrated circuit die 1502 and at least one communication chip 1508 either or both of which may include multiple device strata and one or more dynamic logic circuits fabricated as described herein. In some implementations communication chip 1508 is fabricated as part of integrated circuit die 1502. Integrated circuit die 1502 may include CPU 1504 as well as on-die memory 1506, often used as cache memory, that can be provided by technologies such as embedded DRAM (eDRAM) or spin-transfer torque memory (STTM or STTM-RAM).

Computing device 1500 may include other components that may or may not be physically and electrically coupled to the motherboard or fabricated within an SoC die. These other components include, but are not limited to, volatile memory 1510 (e.g., DRAM), non-volatile memory 1512 (e.g., ROM or flash memory), graphics processing unit 1514 (GPU), digital signal processor 1516, crypto processor 1542 (a specialized processor that executes cryptographic algorithms within hardware), chipset 1520, antenna 1522, display or a touchscreen display 1524, touchscreen controller 1526, battery 1528 or other power source, a power amplifier (not shown), global positioning system (GPS) device 1544, compass 1530, motion coprocessor or sensors 1532 (that may include an accelerometer, a gyroscope, and a compass), speaker 1534, camera 1536, user input devices 1538 (such as a keyboard, mouse, stylus, and touchpad), and mass storage device 1540 (such as hard disk drive, compact disk (CD), digital versatile disk (DVD), and so forth).

Communications chip 1508 enables wireless communications for the transfer of data to and from computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 1508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1500 may include a plurality of communication chips 1508. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Processor 1504 of computing device 1500 includes one or more strata including devices, such as transistors or metal interconnects, that are formed in accordance with embodiments including one or more dynamic logic circuits fabricated as described herein. The term "processor" may refer to any device or portion of a device that processes electronic data from registers and/or memory to transform that electronic data into other electronic data that may be stored in registers and/or memory.

Communication chip 1508 may also include one or more strata including devices, such as transistors or metal interconnects, that are formed in accordance with embodiments including one or more dynamic logic circuits fabricated as described herein.

In further embodiments, another component housed within computing device 1500 may contain one or more strata including devices, such as transistors or metal interconnects, that are formed in accordance with implementations including one or more dynamic logic circuits fabricated as described herein.

In various embodiments, computing device 1500 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 1500 may be any other electronic device that processes data.

EXAMPLES

Example 1 is a dynamic logic circuit including a first transistor including a first semiconductor body within a first device stratum of a substrate; and a second transistor including a second semiconductor body within a second device stratum of the substrate that is different from the first device stratum, wherein the first transistor and the second transistor share a common gate electrode.

In Example 2, the first transistor of the dynamic logic circuit of Example 1 includes a precharge transistor and the second transistor includes an evaluate transistor.

In Example 3, the first transistor of the dynamic logic circuit of Example 2 includes a P-type MOSFET.

In Example 4, the first semiconductor body and the second transistor body each of the dynamic logic circuit of any of Examples 1-3 include a fin.

In Example 5, the gate electrode of the dynamic logic circuit of any of Examples 1-4 wraps around the first semiconductor body and the second transistor body.

In Example 6, the dynamic logic circuit of any of Examples 1-5 further includes an inter-strata interconnect coupled to a drain of the first transistor and a drain of the second transistor.

In Example 7, the inter-strata interconnect of the dynamic logic circuit of Example 6 is coupled to an output line, the circuit further including an inverter cell coupled to the output line.

In Example 8, the inverter cell of the dynamic logic circuit of Example 7 includes a P-type MOSFET and an N-type MOSFET that share a common gate electrode.

Example 9 is a dynamic logic circuit including a P-type MOSFET including a clock input; an N-type MOSFET logic circuit including one or more N-type MOSFETs including one or more logic inputs and an N-type MOSFET including the clock input; and an inverter cell coupled to the N-type logic circuit, wherein the P-type MOSFET is in a different device stratum of a substrate than the N-type MOSFET including the clock input and the P-type MOSFET and the N-type MOSFET including the clock input share a common gate electrode.

In Example 10, a source of the P-type MOSFET of the dynamic logic circuit of Example 9 is coupled to a power source.

In Example 11, the dynamic logic circuit of Example 9 further includes an inter-stratum interconnect coupled to the drain of the P-type MOSFET and the drain of the N-type MOSFET including the clock input.

In Example 12, the inter-stratum interconnect of the dynamic logic circuit of Example 11 is coupled to an output line and the inverter cell is coupled to the output line.

In Example 13, the inverter cell of the dynamic logic circuit of Example 9 includes a P-type MOSFET and an N-type MOSFET that share a common gate electrode.

In Example 14, the P-type MOSFET and the N-type MOSFET of the inverter cell of the dynamic logic circuit of Example 13 are in different device strata on the substrate.

Example 15 is a method including disposing a second semiconductor body of a second transistor on a first semiconductor body of a first transistor in a first device stratum on a substrate, the second semiconductor body defining a second device stratum; and forming a common gate electrode on each of the semiconductor body and the second semiconductor body.

In Example 16, one of the first transistor and the second transistor of the method of Example 15 includes a P-type MOSFET and the other of the first transistor and the second transistor includes an N-type MOSFET.

In Example 17, the method of Example 16 further includes forming an inter-strata interconnect coupled to a drain of the first transistor and a drain of the second transistor.

In Example 18, the inter-strata interconnect of the method of Example 17 is coupled to an output line, the method further including forming an inverter cell coupled to the output line.

In Example 19, the inverter cell of the method of Example 18 includes a P-type MOSFET and an N-type MOSFET that share a common gate electrode.

In Example 20, one of the P-type MOSFET and the N-type MOSFET of the inverter cell of the method of Example 19 is formed in the first device stratum and the other of the P-type MOSFET and the N-type MOSFET of the inverter cell is formed in the second device stratum.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A dynamic logic circuit comprising:
   a first transistor comprising a first semiconductor body within a first device stratum,
   a second transistor comprising a second semiconductor body within a second device stratum, wherein the first transistor and the second transistor share a common gate electrode; and
   an inter-strata interconnect directly vertically between a source or drain region of the first semiconductor body and a source or drain region of the second semiconductor body.

2. The dynamic logic circuit of claim 1, wherein the first transistor comprises a precharge transistor and the second transistor comprises an evaluate transistor.

3. The dynamic logic circuit of claim 2, wherein the first transistor comprises a P-type MOSFET.

4. The dynamic logic circuit of claim 1, wherein the first semiconductor body and the second semiconductor body each comprises a fin.

5. The dynamic logic circuit of claim 1, wherein the common gate electrode wraps around the first semiconductor body and the second semiconductor body.

6. The dynamic logic circuit of claim 1, wherein the inter-strata interconnect is coupled to a drain of the first transistor and a drain of the second transistor.

7. The dynamic logic circuit of claim 6, wherein the inter-strata interconnect is coupled to an output line, the circuit further comprising an inverter cell coupled to the output line.

8. The dynamic logic circuit of claim 7, wherein the inverter cell comprises a P-type MOSFET and an N-type MOSFET that share a common gate electrode.

9. A dynamic logic circuit comprising:
a P-type MOSFET comprising a clock input;
an N-type MOSFET logic circuit comprising one or more N-type MOSFETs comprising one or more logic inputs and an N-type MOSFET comprising the clock input;
an inverter cell coupled to the N-type MOSFET logic circuit, wherein the P-type MOSFET comprises a first semiconductor body in a first device stratum and the N-type MOSFET comprising the clock input comprises a second semiconductor body within a second device stratum, and the P-type MOSFET and the N-type MOSFET comprising the clock input share a common gate electrode; and
an inter-strata interconnect vertically between a source or drain region of the first semiconductor body and a source or drain region of the second semiconductor body.

10. The dynamic logic circuit of claim 9, wherein a source of the P-type MOSFET is coupled to a power source.

11. The dynamic logic circuit of claim 9, wherein the inter-stratum interconnect is coupled to the drain of the P-type MOSFET and the drain of the N-type MOSFET comprising the clock input.

12. The dynamic logic circuit of claim 11, wherein the inter-stratum interconnect is coupled to an output line and the inverter cell is coupled to the output line.

13. The dynamic logic circuit of claim 9, wherein the inverter cell comprises a P-type MOSFET and an N-type MOSFET that share a common gate electrode.

14. The dynamic logic circuit of claim 13, wherein the P-type MOSFET and the N-type MOSFET of the inverter cell are in different device strata on the substrate.

15. A dynamic logic circuit comprising:
a first transistor comprising a first semiconductor body within a first device stratum,
a second transistor comprising a second semiconductor body within a second device stratum, wherein the first transistor and the second transistor share a common gate electrode, and wherein the first semiconductor body and the second semiconductor body each comprises a fin; and
an inter-strata interconnect vertically between the first semiconductor body and the second semiconductor body.

16. The dynamic logic circuit of claim 15, wherein the first transistor comprises a precharge transistor and the second transistor comprises an evaluate transistor.

17. The dynamic logic circuit of claim 15, wherein the inter-strata interconnect is coupled to a drain of the first transistor and a drain of the second transistor.

18. A dynamic logic circuit comprising:
a first transistor comprising a first semiconductor body within a first device stratum,
a second transistor comprising a second semiconductor body within a second device stratum, wherein the first transistor and the second transistor share a common gate electrode, and wherein the common gate electrode wraps around the first semiconductor body and the second semiconductor body; and
an inter-strata interconnect vertically between the first semiconductor body and the second semiconductor body.

19. The dynamic logic circuit of claim 18, wherein the first transistor comprises a precharge transistor and the second transistor comprises an evaluate transistor.

20. The dynamic logic circuit of claim 18, wherein the inter-strata interconnect is coupled to a drain of the first transistor and a drain of the second transistor.

* * * * *